US012635083B2

(12) United States Patent
Suwa et al.

(10) Patent No.: US 12,635,083 B2
(45) Date of Patent: May 19, 2026

(54) LASER PROCESSING METHOD AND CIRCUIT BOARD MANUFACTURING METHOD

(71) Applicant: Gigaphoton Inc., Tochigi (JP)

(72) Inventors: Akira Suwa, Oyama (JP); Kouji Kakizaki, Oyama (JP); Masakazu Kobayashi, Oyama (JP); Junichi Fujimoto, Oyama (JP); Yasufumi Kawasuji, Oyama (JP)

(73) Assignee: Gigaphoton Inc., Tochigi (JP)

( * ) Notice: Subject to any disclaimer, the term of this patent is extended or adjusted under 35 U.S.C. 154(b) by 863 days.

(21) Appl. No.: 18/053,737

(22) Filed: Nov. 8, 2022

(65) Prior Publication Data

US 2023/0071592 A1 Mar. 9, 2023

Related U.S. Application Data

(63) Continuation of application No. PCT/JP2020/025655, filed on Jun. 30, 2020.

(51) Int. Cl.
| | |
|---|---|
| *H05K 3/46* | (2006.01) |
| *B23K 26/066* | (2014.01) |
| *H05K 3/40* | (2006.01) |

(52) U.S. Cl.
CPC ............. *H05K 3/46* (2013.01); *B23K 26/066* (2015.10); *H05K 3/4038* (2013.01); *H05K 2203/107* (2013.01)

(58) Field of Classification Search
CPC ........... B23K 26/066; H05K 2203/107; H05K 3/4038; H05K 3/46
See application file for complete search history.

(56) References Cited

U.S. PATENT DOCUMENTS 5,593,606 A * 1/1997 Owen .................. H05K 3/0038
219/121.8
5,841,102 A 11/1998 Noddin
(Continued)

FOREIGN PATENT DOCUMENTS

| EP | 0 456 243 A2 | 5/1991 |
|---|---|---|
| JP | H04-196194 A | 7/1992 |
(Continued)

OTHER PUBLICATIONS

International Search Report issued in PCT/JP2020/025655; mailed Sep. 24, 2020.
(Continued)

*Primary Examiner* — Steven W Crabb
*Assistant Examiner* — Dilnessa B Belay
(74) *Attorney, Agent, or Firm* — Studebaker Brackett PLLC

(57) ABSTRACT

A laser processing method according to a viewpoint of the present disclosure includes radiating ultraviolet pulse laser light onto a workpiece having a stacked structure in which a conductor layer, an insulating layer, and a sacrificial layer are stacked on each other in the presented order, the pulse laser light radiated from the side facing the sacrificial layer, to change a laser ablation processing mode in the sacrificial layer and form a through hole in the sacrificial layer, radiating the pulse laser light onto the insulating layer through the through hole to form an opening in the insulating layer, and removing the sacrificial layer after the formation of the opening.

17 Claims, 32 Drawing Sheets

(56) References Cited

U.S. PATENT DOCUMENTS

| | | | | |
|---|---|---|---|---|
| 2005/0232316 A1 * | 10/2005 | Akasaka | ............. | B23K 26/064 |
| | | | | 372/25 |
| 2005/0236380 A1 * | 10/2005 | Tsuno | .................... | B23K 26/40 |
| | | | | 219/121.61 |
| 2009/0100673 A1 | 4/2009 | Yukiiri et al. | | |

FOREIGN PATENT DOCUMENTS

| | | | | | |
|---|---|---|---|---|---|
| JP | 2004-209505 | A | 7/2004 | | |
| JP | 2009-099649 | A | 5/2009 | | |
| JP | 2010-226147 | A | 10/2010 | | |
| JP | 5532924 | B2 | 6/2014 | | |
| JP | 2016-092172 | A | 5/2016 | | |
| JP | 5975011 | B2 | 8/2016 | | |
| JP | 6337927 | B2 | 6/2018 | | |
| JP | 2018-136522 | A | 8/2018 | | |
| JP | 6413654 | B2 | 10/2018 | | |
| WO | 2009/035071 | A1 | 3/2009 | | |
| WO | 2009/066759 | A1 | 5/2009 | | |
| WO | WO-2015186712 | A1 * | 12/2015 | ............. | B32B 27/36 |

OTHER PUBLICATIONS

International Preliminary Report on Patentability (Chapter I) and Written Opinion of the International Searching Authority issued in PCT/JP2020/025655; issued Dec. 13, 2022.
An Office Action issued by the Japanese Patent Office on Apr. 22, 2024, which corresponds to Japanese Patent Application No. 2022-532883 and is related to U.S. Appl. No. 18/053,737.

* cited by examiner

FIG. 8

| | ANGLE A (ANGLE AT BOTTOM SURFACE) θa | ANGLE B (ANGLE CALCULATED IN SURFACE SEM IMAGE) θb |
|---|---|---|
| TAPER ANGLE | 89.1° | 87.0° |

*FIG. 19*

| | PROCESSING WITH NO SACRIFICIAL LAYER (COMPARATIVE EXAMPLE) | PROCESSING WITH SACRIFICIAL LAYER REMOVED AFTER PROCESSING (FIRST EMBODIMENT) |
|---|---|---|
| RADIATION CONDITIONS | FLUENCE F: 1000 mJ/cm² REPETITION FREQUENCY f: 4000 Hz RADIATED PULSE COUNT: 60 pls PULSE WIDTH: 20 ns | FLUENCE F: 1000 mJ/cm² REPETITION FREQUENCY f: 4000 Hz RADIATED PULSE COUNT: 180 pls PULSE WIDTH: 20 ns |
| SURFACE SEM IMAGE | | |
| CROSS-SECTIONAL SEM IMAGE | | |
| TAPER ANGLE θb | 87.0° | 87.9° |
| DIAMETER OF PROCESSED HOLE | 21.5 μm | 18.2 μm |

FIG. 31
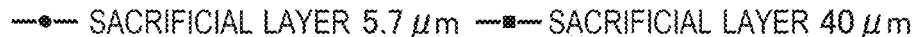
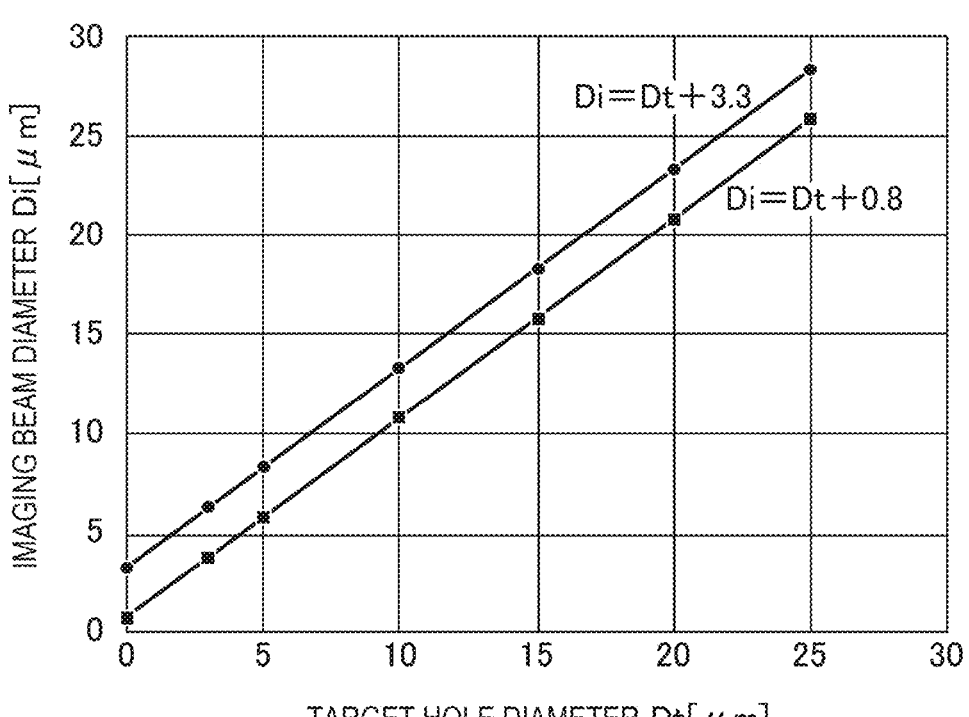
TARGET HOLE DIAMETER Dt[$\mu$m]
FIG. 32
| Dtop | SACRIFICIAL LAYER 5.7 $\mu$m | SACRIFICIAL LAYER 40 $\mu$m |
|---|---|---|
| 0 | 0.8 | 3.3 |
| 3 | 3.8 | 6.3 |
| 5 | 5.8 | 8.3 |
| 10 | 10.8 | 13.3 |
| 15 | 15.8 | 18.3 |
| 20 | 20.8 | 23.3 |
| 25 | 25.8 | 28.3 |

AREA A

LASER PROCESSING METHOD AND CIRCUIT BOARD MANUFACTURING METHOD

CROSS-REFERENCE TO RELATED APPLICATIONS

The present application is a continuation application of International Application No. PCT/JP2020/025655, filed on Jun. 30, 2020, the entire contents of which are hereby incorporated by reference.

BACKGROUND

1. Technical Field

The present disclosure relates to a laser processing method and a circuit board manufacturing method.

2. Related Art

Circuit boards, which are widely used in a variety of electronic instruments, are required to have finer, denser circuit wiring as the electronic instruments are miniaturized and equipped with advanced functions. As a circuit board manufacturing technology, there is a known manufacturing method based on a build-up scheme in which an insulating layer and a conductor layer are alternately stacked on an inner layer substrate. In the manufacturing method based on the build-up scheme, the insulating layer is formed by using, for example, an adhesive layer including a support and a resin composition layer provided on the support to stack the resin composition layer on the inner layer substrate, and thermally curing the resin composition layer. The thus formed insulating layer is then irradiated with laser light to form via holes for connecting the conductor layer.

To achieve higher circuit wiring density, it is desired to reduce the diameter of the via holes. Via holes are typically formed by laser drilling, and carbon dioxide gas lasers, which are advantageous in terms of high drilling speed and low manufacturing cost, are currently used as a primary choice.

There is, however, a limit to the size reduction of via holes. For example, it is difficult for a carbon dioxide gas laser to form a via hole having an opening diameter smaller than or equal to 25 μm.

For further miniaturization of via holes, use of excimer lasers (abbreviation for excited dimer laser) is examined as an alternative to carbon dioxide lasers.

The excimer laser light, which has a pulse width of about several tens of nanoseconds and has a short wavelength of, for example, 248.4 nm or 193.4 nm, is used in some cases to directly process a polymer material, a glass material, and other materials.

The excimer laser light having photon energy higher than the binding energy of a polymer material can unbind the molecules that form the polymer material. Non-thermal processing can therefore be performed, and it is known that an excellent processed shape is achieved by the non-thermal processing.

Excimer lasers generally produce intense laser light that belongs to the ultraviolet region and therefore do not generate heat, unlike infrared lasers such as carbon dioxide gas lasers. Finer processing is therefore achievable and is expected to contribute to reduction in the diameter of via holes.

CITATION LIST

Patent Literature

[PTL 1] Japanese Patent No. 6,413,654
[PTL 2] Japanese Patent No. 5,532,924
[PTL 3] Japanese Patent No. 5,975,011
[PTL 4] Japanese Patent No. 6,337,927

SUMMARY

A laser processing method according to a viewpoint of the present disclosure includes radiating ultraviolet pulse laser light onto a workpiece having a stacked structure in which a conductor layer, an insulating layer, and a sacrificial layer are stacked on each other in the presented order, the pulse laser light radiated from a side facing the sacrificial layer, to change a laser ablation processing mode in the sacrificial layer and form a through hole in the sacrificial layer, radiating the pulse laser light onto the insulating layer through the through hole to form an opening in the insulating layer, and removing the sacrificial layer after the formation of the opening.

A circuit board manufacturing method according to another viewpoint of the present disclosure includes radiating ultraviolet pulse laser light onto a circuit board having a stacked structure in which a first conductor layer, a first insulating layer, and a first sacrificial layer are stacked on a principal surface of the circuit board in the presented order, the pulse laser light radiated from a side facing the first sacrificial layer, to change a laser ablation processing mode in the first sacrificial layer and form a first through hole in the first sacrificial layer, radiating the pulse laser light onto the first insulating layer through the first through hole to form a first via hole in the first insulating layer, and removing the first sacrificial layer after the formation of the first via hole.

BRIEF DESCRIPTION OF THE DRAWINGS

Embodiments of the present disclosure will be described below only by way of example with reference to the accompanying drawings.

FIG. 8 shows that the via hole processing is performed on interlayer insulating layers.

FIG. 19 is a table showing the result of the via hole processing using a laser processing method according to Comparative Example and the result of the via hole processing using a laser processing method according to a first embodiment.

FIG. 31 is a graph showing the relationship between a target hole diameter Dt and an imaging beam diameter Di.

FIG. 32 is a table showing original data based on which the graph shown in FIG. 31 is drawn.

FIG. 43 is a cross-sectional view showing an example of a second interlayer insulating layer and sacrificial layer formation step.

FIG. 44 is a cross-sectional view showing an example of a second via hole formation and sacrificial layer removal step.

FIG. 51 is a plan view showing an example of a mask pattern of the mask used in the laser processing system according to a fourth embodiment.

FIG. 52 is a side view of the mask shown in FIG. 51.

DETAILED DESCRIPTION

Contents

Figures 1, 2:
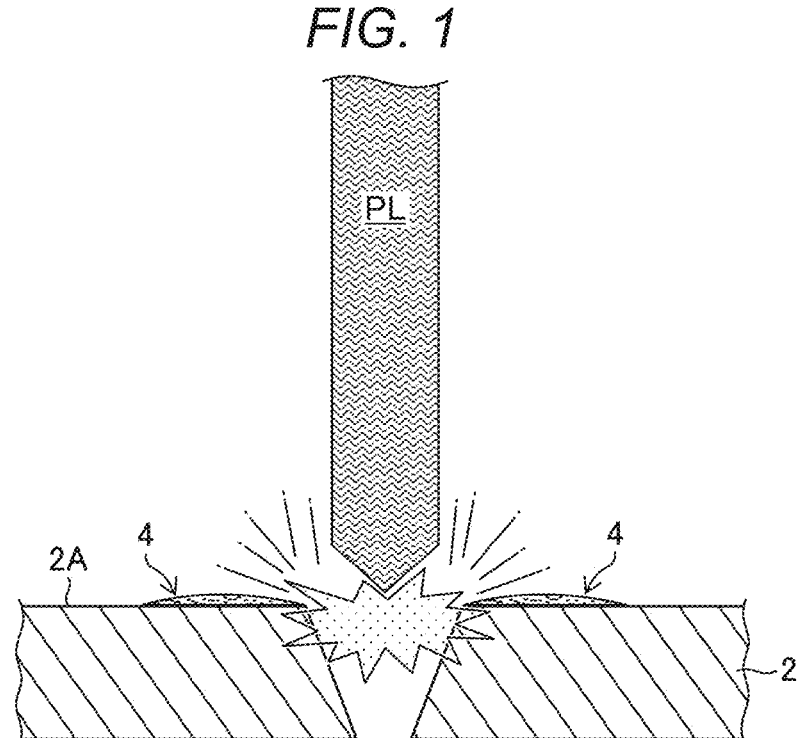
FIG. 1 describes laser ablation processing.
FIG. 2 is a cross-sectional view diagrammatically showing an example of a circuit board including an electrically insulating material layer having undergone via hole processing using the laser ablation.

1. Description of terms
1.1 Laser ablation processing and debris
1.2 Via hole processing and definition of taper angle
2. Overview of laser processing system
2.1 Configuration
2.2 Operation
2.2.1 Example of via hole processing
2.2.2 Overview of operation of laser processing system
2.2.3 Example of how to control laser processing system 2.3 Problems
3. First Embodiment
3.1 Configuration
3.2 Operation
3.3 Example of result of processing
3.4 Effects
3.5 Assumption principle
3.6 Thickness of sacrificial layer
3.7 Amount of shift of diameter of processed hole
4. Second Embodiment
4.1 Configuration
4.2 Operation
4.3 Effects
5. Third Embodiment
5.1 Configuration
5.2 Operation
5.3 Effects
5.4 Variations
6. Fourth Embodiment
6.1 Configuration
6.2 Operation
6.3 Effects
7. Examples of material of interlayer insulating layer
8. Examples of material of sacrificial layer
9. Examples of radiation conditions under which pulse laser light is radiated
10. Method for manufacturing circuit board
11. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Terms

1.1 Laser Ablation Processing and Debris

FIG. 1 describes laser ablation processing. FIG. 1 shows, as an example of the non-thermal processing, a case where a polymeric organic material 2 is irradiated with ultraviolet pulse laser light PL. When the polymeric organic material 2 is irradiated with the pulse laser light PL, a material surface 2A instantly melts and evaporates, releasing ions, atoms, radicals, molecules, clusters, solid fragments, and other substances, as shown in FIG. 1. The phenomenon described above is broadly referred to as laser ablation. The substances scattered from the material surface 2A due to the laser ablation form fine particles called debris 4 and re-deposit on the material surface 2A, contaminating the area around the portion under processing in some cases. The debris 4 includes fine particles and gases.

1.2 Via Hole Processing and Definition of Taper Angle

FIG. 2 is a cross-sectional view diagrammatically showing an example of a circuit board 6 including an electrically insulating material layer 8 having undergone via hole processing using the laser ablation. FIG. 2 shows an example of a structure in which a conductor layer 7 and the electrically insulating material layer 8 are stacked on the circuit board 6 as an inner layer substrate (core substrate). The conductor layer 7 may be made, for example, of copper (Cu). When the electrically insulating material layer 8 is irradiated with the ultraviolet pulse laser light PL, a via hole is processed by the laser ablation. As a parameter corresponding to the profile of a sidewall 9 processed as described above, the angle between a principal surface 7A of the conductor layer 7 and the sidewall 9 of the via hole is defined as a taper angle θ, as shown in FIG. 2. It is generally considered that the taper angle θ in the via hole processing is preferably as close to 90° as possible.

Figure 3:
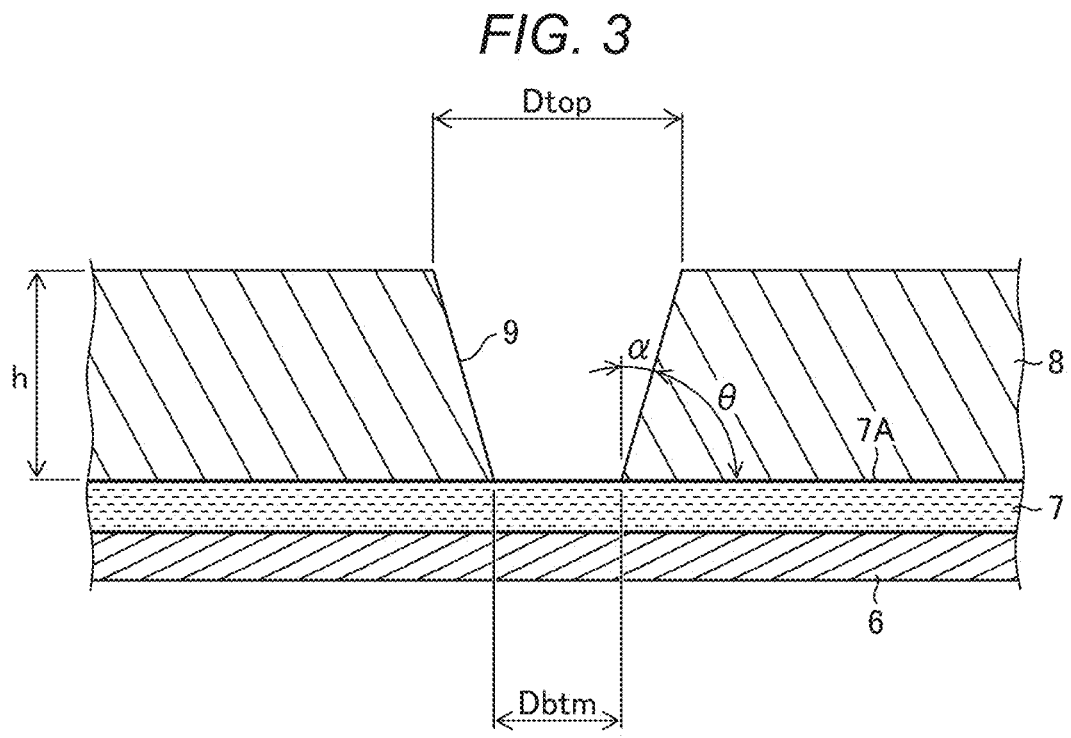
FIG. 3 is a cross-sectional view showing a taper angle of a sidewall of a via hole.

The profile of the sidewall 9 of the via hole may be evaluated by a slope ratio Gr of a diameter Dtop of the opening at the processed surface to a diameter Dbtm of the bottom surface, as shown in FIG. 3.

The slope ratio Gr is expressed by Expression (1) below.

$$Gr = \{(Dtop/2) - (Dbtm/2)\}/h \tag{1}$$

Reference character h represents the thickness of the electrically insulating material layer 8.

The relationship between the slope ratio Gr and a slope α is expressed by Expression (2) below.

$$\alpha = \tan^{-1}\{Gr\} \tag{2}$$

The relationship between the slope α and the taper angle θ is expressed by Expression (3).

$$\theta = 90° - \alpha \tag{3}$$

The diameter Dtop of a via hole at the processed surface is called a "top diameter", and the diameter Dbtm of the via hole at the bottom surface is called a "bottom diameter" in some cases. The term "taper angle" under the definition described above is not exclusively used for via holes but used in typical through hole processing.

An "insulating layer" is synonymous with the electrically insulating material layer.

2. Overview of Laser Processing System

2.1 Configuration

Figure 4:
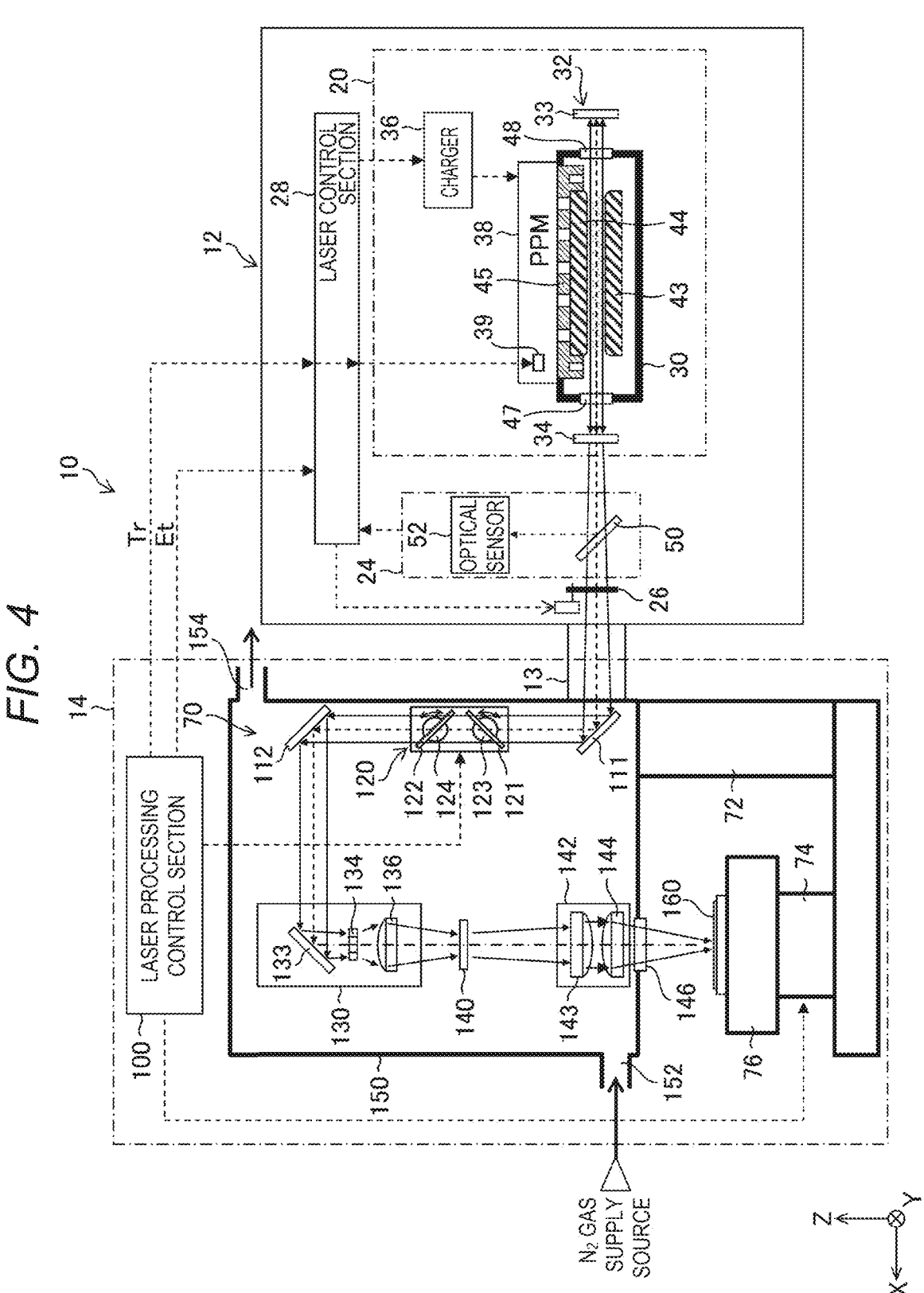
FIG. 4 schematically shows the configuration of an exemplary laser processing system.

FIG. 4 schematically shows the configuration of an exemplary laser processing system 10. The laser processing system 10 includes a laser apparatus 12, an optical path tube 13, and a laser processing apparatus 14. The laser apparatus 12 is a laser apparatus that outputs ultraviolet pulse laser light. For example, the laser apparatus 12 may be a discharge-excitation-type laser apparatus containing $F_2$, ArF, KrF, XeCl, or XeF as the laser medium. The laser apparatus 12 includes an oscillator 20, a monitor module 24, a shutter 26, and a laser control section 28.

The oscillator 20 includes a chamber 30, an optical resonator 32, a charger 36, and a pulse power module (PPM) 38. The chamber 30 encapsulates an excimer laser gas. The chamber 30 includes a pair of electrodes 43 and 44, an insulating member 45, and windows 47 and 48.

The optical resonator 32 includes a rear mirror 33 and an output coupler (OC) 34. The rear mirror 33 and the output coupler 34 are each formed of a planar substrate coated with a highly reflective film and a partially reflective film. The chamber 30 is disposed in the optical path of the optical resonator 32.

The PPM 38 includes a switch 39 and a charging capacitor that is not shown. The switch 39 is connected to a signal line that transmits a control signal that is outputted from the laser control section 28 and controls the switch 39.

The charger 36 is connected to the charging capacitor of the PPM 38. The charger 36 receives charging voltage data from the laser control section 28 and charges the charging capacitor of the PPM38.

The monitor module 24 includes a beam splitter 50 and an optical sensor 52.

The shutter 26 is disposed in the optical path of the pulse laser light outputted from the monitor module 24. The optical path of the pulse laser light may be encapsulated by an enclosure and an optical path tube none of which is shown and may be purged with an N$_2$ gas.

The laser processing apparatus 14 includes a radiation optical system 70, a frame 72, an XYZ stage 74, a table 76, and a laser processing control section 100.

The radiation optical system 70 includes highly reflective mirrors 111 and 112, an attenuator 120, an illumination optical system 130, a mask 140, a projection optical system 142, a window 146, and an enclosure 150.

The highly reflective mirror 111 is so disposed that the pulse laser light having passed through the optical path tube 13 passes through the attenuator 120 and is incident on the highly reflective mirror 112.

The attenuator 120 is disposed in the optical path between the highly reflective mirror 111 and the highly reflective mirror 112. The attenuator 120 includes two partially reflective mirrors 121 and 122 and rotary stages 123 and 124, which change the angles of incidence of the pulse laser light incident on the partially reflective mirrors 121 and 122.

The highly reflective mirror 112 is so disposed that the laser light having passed through the attenuator 120 enters the illumination optical system 130.

The illumination optical system 130 includes a highly reflective mirror 133, a fly-eye lens 134, and a condenser lens 136. The illumination optical system 130 is disposed so as to illuminate the mask 140 with a rectangular beam in the form of Koehler illumination. A rectangular beam having a substantially uniform in-beam optical intensity distribution is called a "rectangular beam".

The highly reflective mirror 133 of the illumination optical system 130 is so disposed that the pulse laser light incident thereon enters the fly-eye lens 134.

The fly-eye lens 134 is, for example, so disposed that the focal plane of the fly-eye lens 134 coincides with the front focal plane of the condenser lens 136. The condenser lens 136 is so disposed that the rear focal plane of the condenser lens 136 coincides with the position of the mask 140.

The illumination optical system 130 is so disposed that the mask 140 is uniformly illuminated with the laser light.

Figure 5:
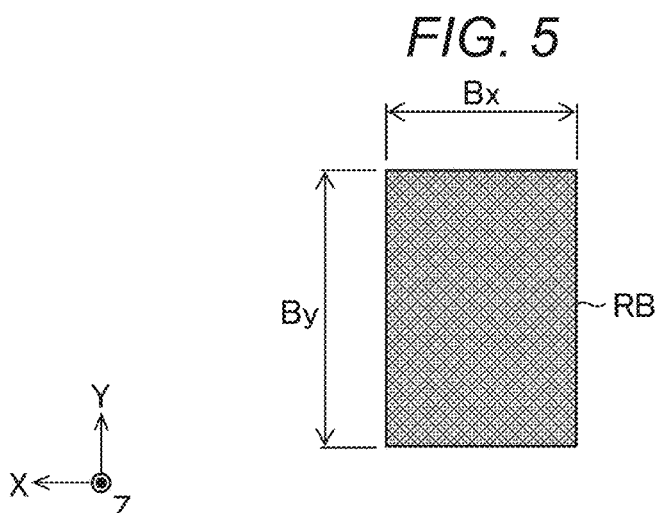
FIG. 5 shows an example of a rectangular beam with which a mask is illuminated.

FIG. 5 shows an example of a rectangular beam RB, with which the mask 140 is illuminated. For example, the long side of the rectangular beam RB may be parallel to a Y-axis direction, and the short side of the rectangular beam RB may be parallel to an X-axis direction. The beam width of the rectangular beam RB in the Y-axis direction may be By, and the beam width of the rectangular beam RB in the X-axis direction may be Bx (Bx<By).

The mask 140 is, for example, a photomask formed of a synthetic quartz substrate which transmits ultraviolet light and on which a pattern formed of a metal or dielectric multilayer film is formed. For example, to form via holes in a printed circuit board or any other substrate, a pattern for processing holes each having a diameter ranging from 5 μm to 30 μm is formed on the mask 140. Let M be the magnification of the projection optical system 142, and a pattern having dimensions being 1/M times dimensions to be achieved by the processing is formed on the mask 140.

The projection optical system 142 is disposed so as to form an image of the mask 140 on the surface of a workpiece 160 via the window 146. The projection optical system 142 may be a unit lens formed of a plurality of lenses 143 and 144 and may be a reduction projection optical system.

The window 146 is disposed in the laser optical path between the projection optical system 142 and the workpiece 160. The window 146 is disposed in a hole provided in the enclosure 150, for example, via an O ring that is not shown. The window 146 is a substrate made of CaF$_2$ crystal or synthetic quartz, which transmits excimer laser light, and may be coated with reflection suppression films on opposite sides.

The enclosure 150 has an inlet 152 and an outlet 154, via which an N$_2$ gas enters and exits out of the enclosure 150. The inlet 152 is connected to an N$_2$ gas supply source via a tube that is not shown. The enclosure 150 may be so sealed, for example, with O rings that outside air does not enter the enclosure 150.

The radiation optical system 70 and the XYZ stage 74 are fixed to the frame 72. The table 76 is fixed onto the XYZ stage 74. The workpiece 160 is fixed onto the table 76. The table 76 is an example of a placement base on which the workpiece 160 is placed.

The workpiece 160 may, for example, be an interposer substrate that functions as a relay between an LSI (large-scale integrated circuit) chip and a main printed circuit board or a flexible printed circuit board. The substrate that forms the workpiece 160 is made of an electrically insulating material, for example, a polymer material, a glass epoxy material, and a glass material.

The laser processing control section 100 controls the operation of the laser apparatus 12, the attenuator 120, and the XYZ stage 74.

A control apparatus that functions as each of the laser processing control section 100, the laser control section 28, and other control sections can be achieved by a combination of hardware formed of one or more computers and software installed thereon. The software is synonymous with a program. A programmable controller is encompassed in the concept of a computer. The computers can each be formed of a CPU (central processing unit) and a storage apparatus such as a memory. The CPU is an example of a processor.

The storage apparatus is a tangible, non-transitory computer readable medium, including, for example, a memory that is a primary storage apparatus and a storage that is an auxiliary storage apparatus. The computer readable medium may, for example, be a semiconductor memory, a hard disk drive (HDD) apparatus, or a solid state drive (SSD) apparatus, or a combination of a plurality of the components described above. The program to be executed by the processor is stored in the computer readable medium. The processor may include the computer readable medium.

Part or entirety of the processing functions of the control apparatus may be achieved by using an integrated circuit represented by an FPGA (field programmable gate array) and an ASIC (application specific integrated circuit).

The functions of a plurality of control apparatuses can be achieved by a single control apparatus. Furthermore, in the present disclosure, the control apparatuses may be connected to each other via a communication network, such as a local area network and the Internet. In a distributed computing environment, a program unit may be saved in both local and remote memory storage devices. The processor used as the control apparatus in the present disclosure, such as the laser processing control section 100 and the laser control section 28, is a processing apparatus including a storage apparatus that stores a control program and a CPU that executes the control program. The processor is particularly configured or programmed to carry out a variety of processes contained in the present disclosure.

2.2 Operation

2.2.1 Example of Via Hole Processing

Figure 6:
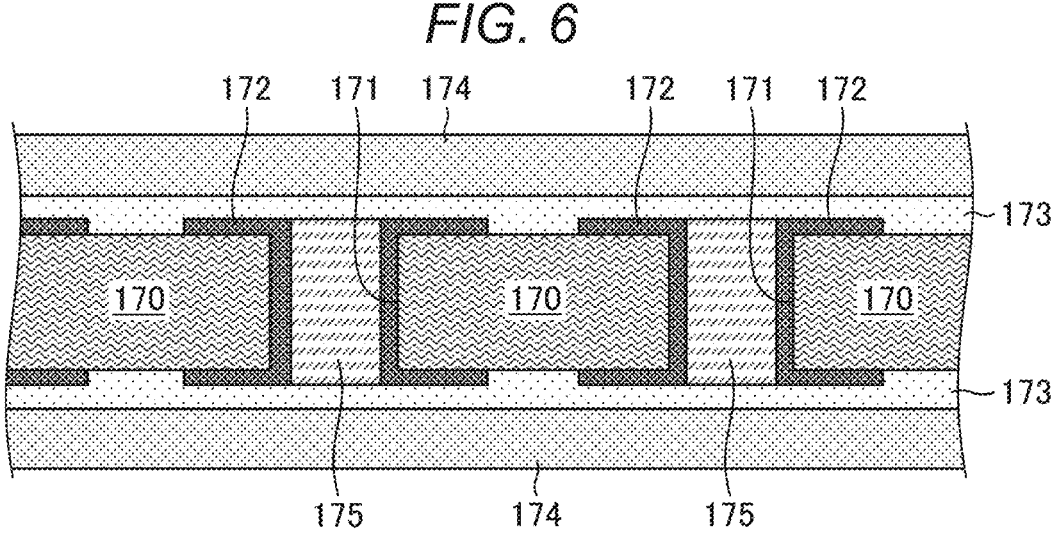
FIG. 6 is a cross-sectional view schematically showing the state of the circuit board before processed.
Figure 7:
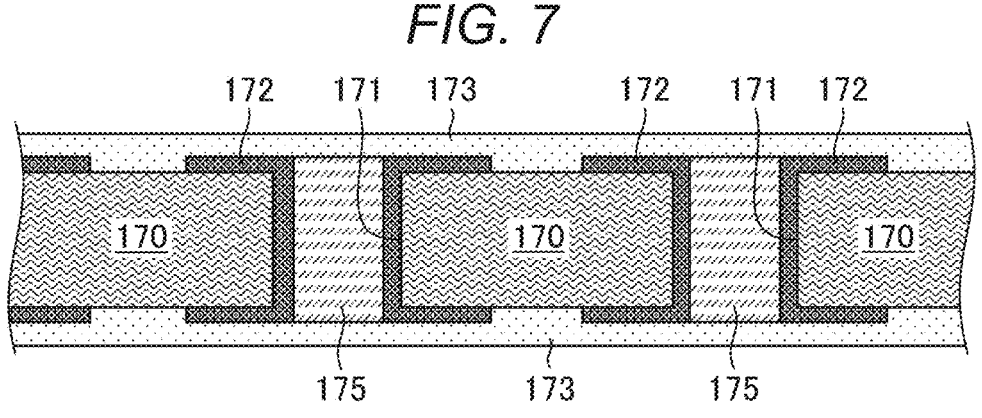
FIG. 7 is a cross-sectional view showing the state in which polymer compound layers have been removed from the state in FIG. 6.
Figure 8:
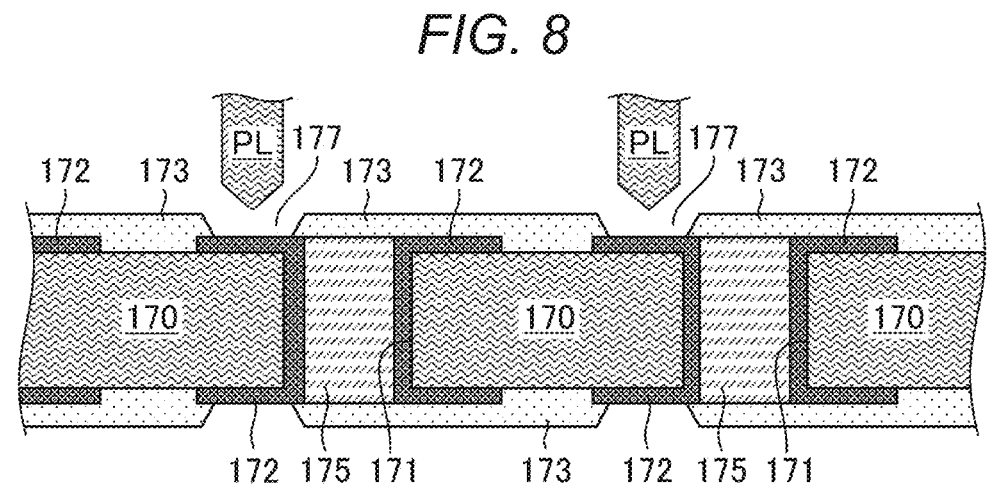

FIGS. 6 to 8 show an exemplary circuit board 170, and a laser processing method according to Comparative Example using the laser processing system 10 will be described. Comparative Example in the present disclosure is an aspect that the applicant is aware of as known only by the applicant, and is not a publicly known example that the applicant is self-aware of.

To perform the via hole processing by using the laser processing system 10, the circuit board 170 is first prepared. FIG. 6 is a cross-sectional view schematically showing the state of the circuit board 170 before processed. Through holes 171, which pass through the opposite surfaces of the circuit board 170, are formed therein, and a conductor layer 172, which allows conduction between the opposite surfaces of the board, is formed on the inner wall of each of the through holes 171 and therearound, as shown in FIG. 6. The conductor layer 172 is formed so as to cover part of the principal surface of the circuit board 170. In addition, interlayer insulating layers 173 are formed so as to cover the conductor layers 172 and the circuit board 170, and polymer compound layers 174 are further formed so as to cover the interlayer insulating layer 173. The thus formed conductor layers 172, interlayer insulating layers 173, and polymer compound layers 174 are stacked on each other in this order, and the stacked structures are formed at opposite surfaces of the circuit board 170. An insulating layer 175 is formed at the inner side of each of the through holes 171.

The interlayer insulating layers 173 may, for example, each be an Ajinomoto build-up film (ABF). The "Ajinomoto build-up film (ABF)" is a registered trademark of Ajinomoto Co., Inc. The polymer compound layers 174 may, for example, each be a polyethylene terephthalate (PET) layer.

To perform the via hole processing on the interlayer insulating layers 173 of the circuit board 170 covered with the polymer compound layers 174, the polymer compound layer 174 at the surface to be irradiated with the laser light is removed to expose the interlayer insulating layer 173, as shown in FIG. 6.

FIG. 7 shows the state in which the polymer compound layers 174 have been removed. Before performing the laser processing, the polymer compound layers 174 are removed as shown in FIG. 7. For example, the polymer compound layers 174 may be removed by peeling off the polymer compound layers 174 from the state shown in FIG. 6. The circuit board 170 is placed as the workpiece 160 on the table 76 of the laser processing apparatus 14 with the interlayer insulating layers 173 exposed, as shown in FIG. 7. The pulse laser light PL is radiated onto the exposed interlayer insulating layers 173 to perform the via hole processing on the interlayer insulating layers 173.

FIG. 8 shows how the via hole processing is performed on the interlayer insulating layers 173. When the interlayer insulating layers 173 are irradiated with the pulse laser light PL, the via hole processing is performed on the interlayer insulating layers 173 to form via holes 177, which reach the conductor layers 172. The operation of the laser processing system 10 will be described below.

2.2.2 Overview of Operation of Laser Processing System

The laser processing control section 100 reads radiation condition parameters during the laser processing. Specifically, the laser processing control section 100 reads fluence Fi, a radiated pulse count Ni, and a repetition frequency fi at the workpiece 160 under the laser processing.

The laser processing control section 100 then causes the laser apparatus 12 to perform tuning oscillation. The tuning oscillation is performed in the procedure below.

The laser control section 28 of the laser apparatus 12 receives target pulse energy Et from the laser processing control section 100. Upon reception of the target pulse energy Et, the laser control section 28 closes the shutter 26 and controls the charger 36 in such a way that the pulse energy of the laser light from the oscillator 20 becomes the target pulse energy Et.

The laser control section 28 uses an internal trigger signal that is not shown to provide the switch 39 of the PPM 38 with a trigger signal. As a result, the oscillator 20 performs spontaneous oscillation.

The pulse laser light outputted from the oscillator 20 is sampled by the beam splitter 50 of the monitor module 24, and pulse energy E is measured with the optical sensor 52.

The laser control section 28 controls the charging voltage applied to the charger 36 in such a way that a difference $\Delta E$ between the pulse energy E and the target pulse energy Et approaches zero.

The laser control section 28 transmits an external trigger OK signal to the laser processing control section 100 to open the shutter 26 when $\Delta E$ falls within an acceptable range. The tuning oscillation is thus completed, and the laser processing is ready.

The laser processing control section 100 then controls the XYZ stage 74 to move in the X-axis and Y-axis directions in such a way that a processing target area on the workpiece 160 that is the area to be first irradiated with the laser light is irradiated with the laser light.

The laser processing control section 100 further controls the XYZ stage 74 to move in the Z-axis direction in such a way that the image of the mask 140 is formed at the position of the surface of the workpiece 160.

The laser processing control section 100 calculates transmittance T provided by the attenuator 120 in such a way that the fluence at the position of the surface of the workpiece 160 (position of image of mask 140) is equal to target fluence Fi.

The laser processing control section 100 subsequently controls the angles of incidence of the pulse laser light incident on the two partially reflective mirrors 121 and 122 by using the rotary stages 123 and 124 in such a way that the attenuator 120 provides the transmittance T.

When the laser radiation is ready as described above, the laser processing control section 100 transmits a light emission trigger signal Tr, which contains the repetition frequency fi and the radiated pulse count Ni, to the laser control section 28.

As a result, the pulse laser light having passed through the beam splitter 50 of the monitor module 24 enters the laser processing apparatus 14 through the optical path tube 13 in sync with the light emission trigger signal Tr.

The pulse laser light having entered the laser processing apparatus 14 is reflected off the highly reflective mirror 111, and passes through the attenuator 120, which attenuates the pulse laser light, and the attenuated pulse laser light is reflected off the highly reflective mirror 112.

The pulse laser light reflected off the highly reflective mirror 112 enters the illumination optical system 130, which spatially homogenizes the optical intensity of the pulse laser light and shapes the pulse laser light into the rectangular beam. The rectangular beam having exited out of the illumination optical system 130 is incident on the mask 140.

The pulse laser light having passed through the mask 140 enters the projection optical system 142, which projects the pulse laser light as an image of the mask 140 on the surface of the workpiece 160 with the size of the pulse laser light reduced.

The pulse laser light having the fluence Fi, the repetition frequency fi, and the radiated pulse count Ni passes through the projection optical system 142 and is radiated onto the workpiece surface of the interlayer insulating layer 173 in the area where the transferred image of the mask 140 is formed.

As a result, a portion of the surface of the interlayer insulating layer 173, the portion irradiated with the pulse laser light, is ablated, forming a very small tubular opening with the conductor layer 172 exposed at the bottom surface. The very small opening is called the via hole 177 (see FIG. 8).

The rectangular beam radiated onto the mask 140 causes the image of the mask 140 to be projected onto the interlayer insulating layer 173 with the image reduced in size.

The pulse laser light having the fluence Fi, the repetition frequency fi, and the radiated pulse count Ni, which are laser processing conditions (radiation conditions), is radiated onto the interlayer insulating layer 173.

The XYZ stage 74 is then controlled to move in the X-axis and Y-axis directions in such a way that the next area of the workpiece 160 is irradiated with the laser light.

The aforementioned control of the XYZ stage 74, control of the attenuator 120, and radiation of the pulse laser light synchronized with the light emission trigger signal Tr are repeated until the workpiece 160 has no area to be processed.

As described above, the laser processing system 10 performs the laser processing by moving the rectangular beam on a processing target area basis to radiate the pulse laser light. The processing target area is then sequentially changed to perform beam scanning laser processing.

2.2.3 Example of how to Control Laser Processing System

Figure 9:
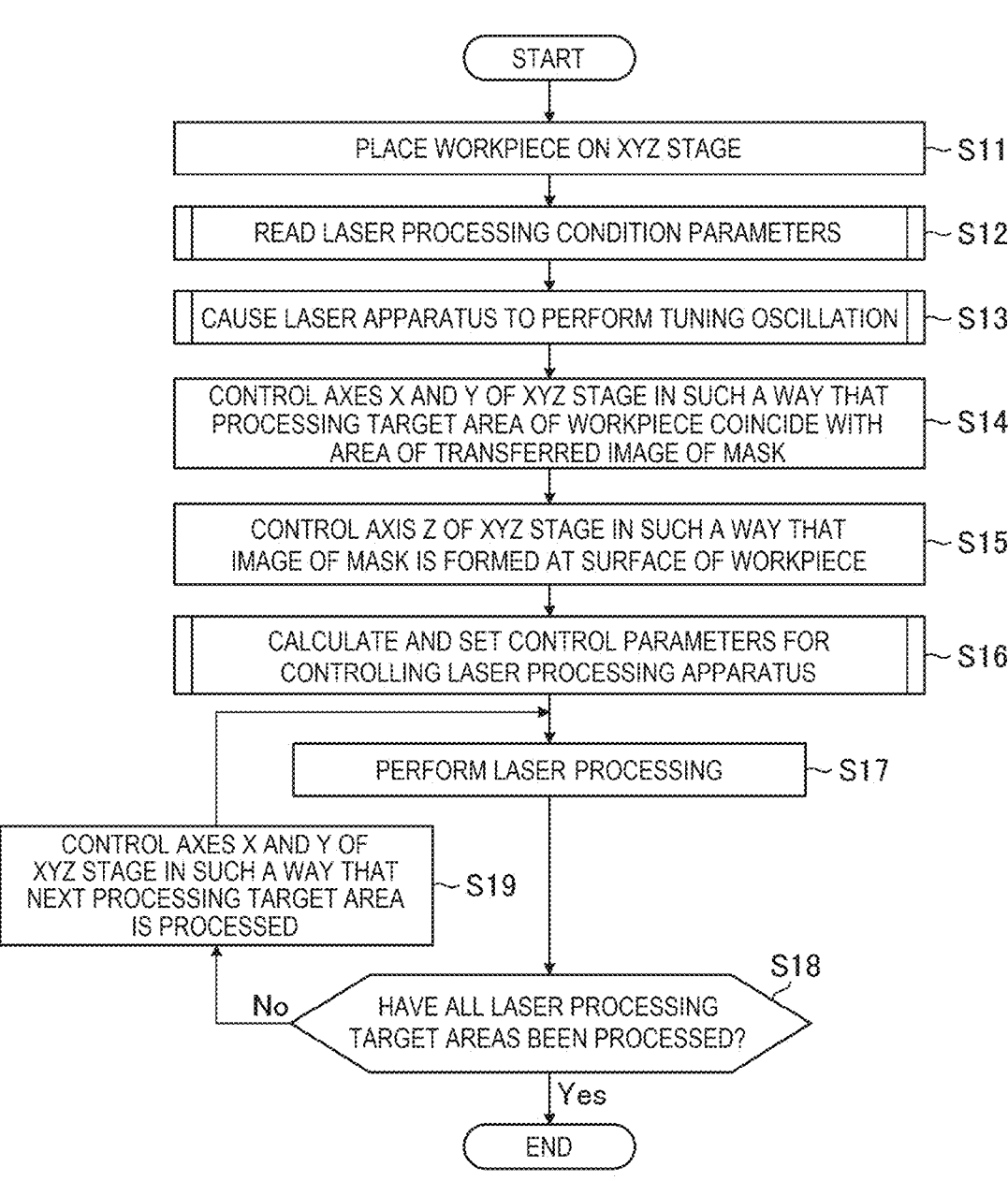
FIG. 9 is a flowchart showing an example of how to control the laser processing system.

FIG. 9 is a flowchart showing an example of how to control the laser processing system 10. In step S11, the workpiece 160 is placed on the table 76 fixed to the XYZ stage 74. The workpiece 160 may be placed on the table 76 by a workpiece conveying robot or any other automatic conveyer that is not shown. After the workpiece 160 is placed on the table 76, an alignment optical system that is not shown allows the position of the workpiece 160 on the table 76 to be determined and match with the processing position.

In step S12, the laser processing control section 100 reads laser processing condition parameters. The laser processing condition parameters are laser radiation condition parameters during the laser processing and include, for example, the fluence Fi, the radiated pulse count Ni, and the repetition frequency fi.

In step S13, the laser processing control section 100 causes the laser apparatus 12 to perform the tuning oscillation. The laser processing control section 100 causes the laser apparatus 12 to perform the tuning oscillation at the repetition frequency fi in such a way that the laser apparatus 12 outputs pulse laser light having the target pulse energy Et.

In step S14, the laser processing control section 100 controls the XYZ stage 74 to move in the X-axis and Y-axis directions in such a way that the laser processing target area is located in a first processing target area.

In step S15, the laser processing control section 100 controls the XYZ stage 74 to move in the Z-axis direction in such a way that the image of the mask 140 is formed at the surface of the workpiece 160.

In step S16, the laser processing control section 100 calculates and sets control parameters for controlling the laser processing apparatus 14. The control parameters for controlling the laser processing apparatus 14 include control parameters during the laser processing. Specifically, the laser processing control section 100 calculates the transmittance T provided by the attenuator 120 in such a way that fluence Fi is achieved at the workpiece 160, and sets the determined transmittance T. The laser processing control section 100 further sets the repetition frequency fi and the radiated pulse count Ni.

In step S17, the laser processing control section 100 controls the laser apparatus 12 and the laser processing apparatus 14 to perform the laser processing. During the laser processing, the light emission trigger signal Tr containing the repetition frequency fi and the radiated pulse count Ni set in step S16 is transmitted from the laser processing apparatus 14 to the laser apparatus 12, so that the workpiece 160 is irradiated with the pulse laser light having the repetition frequency fi, the fluence Fi, and the radiated pulse count Ni.

In step S18, the laser processing control section 100 evaluates whether or not all the laser processing target areas have been processed.

When the result of the evaluation in step S18 is No, the laser processing control section 100 proceeds to step S19. In step S19, the laser processing control section 100 controls the XYZ stage 74 to move in the X-axis and Y-axis directions in such a way that the laser processing target area is located in the next processing target area, and then returns to step S17.

The laser processing control section 100 repeats steps S17 to S19 until all the processing target areas are processed. When all the processing target areas have been processed and the result of the evaluation in step S18 is Yes, the laser processing control section 100 terminates the flowchart of FIG. 9.

Figure 10:
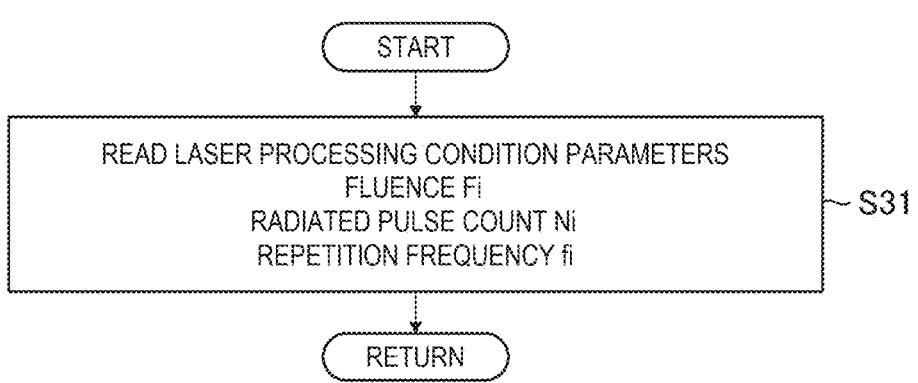
FIG. 10 is a flowchart showing an example of the process of reading laser processing condition parameters.

FIG. 10 is a flowchart showing an example of the process of reading the laser processing condition parameters. The flowchart shown in FIG. 10 is applied to step S12 in FIG. 9.

In step S31 in FIG. 10, the laser processing control section 100 reads the fluence Fi, the radiated pulse count Ni, and the repetition frequency fi at the workpiece 160 under the laser processing. The radiated pulse count Ni is an integer greater than or equal to 2. After step S31, the laser processing control section 100 terminates the flowchart of FIG. 10 and returns to the main procedure in FIG. 9.

Figure 11:
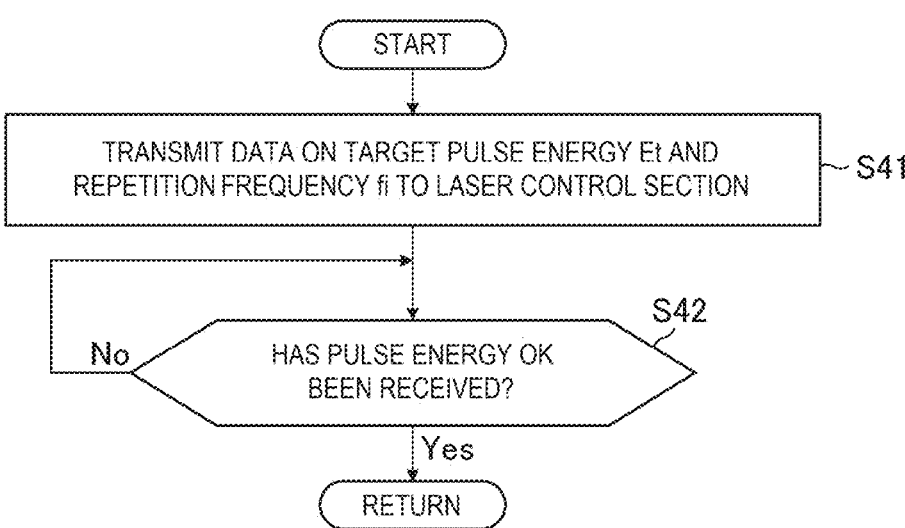
FIG. 11 is a flowchart showing an example of the content of the process carried out when a laser apparatus performs tuning oscillation.

FIG. 11 is a flowchart showing an example of the content of the process carried out when the laser apparatus 12 performs the tuning oscillation. The flowchart shown in FIG. 11 is applied to step S13 in FIG. 9.

In step S41 in FIG. 11, the laser processing control section 100 transmits data on the target pulse energy Et and the repetition frequency fi to the laser control section 28. The target pulse energy Et and the repetition frequency fi in this case are preferably rated data that allow the laser apparatus 12 to stably operate. For example, the target pulse energy Et may fall within a range from 30 mJ to 100 mJ. The repetition frequency fi may fall within a range from 100 Hz to 6000 Hz. The laser processing control section 100 stores in advance the rated pulse energy of the laser light from the laser apparatus 12 as the target pulse energy Et.

In step S42, the laser processing control section 100 evaluates whether or not a pulse energy OK signal has been received from the laser control section 28. The evaluation in step S42 corresponds to evaluation of whether or not the difference between the pulse energy E of the pulse laser light outputted from the laser apparatus 12 and the target pulse energy Et falls within the acceptable range.

The laser processing control section 100 repeats step S42 until the result of the evaluation in step S42 becomes Yes. When the result of the evaluation in step S42 is Yes, the laser processing control section 100 terminates the flowchart of FIG. 11 and returns to the main procedure in FIG. 9.

Figure 12:
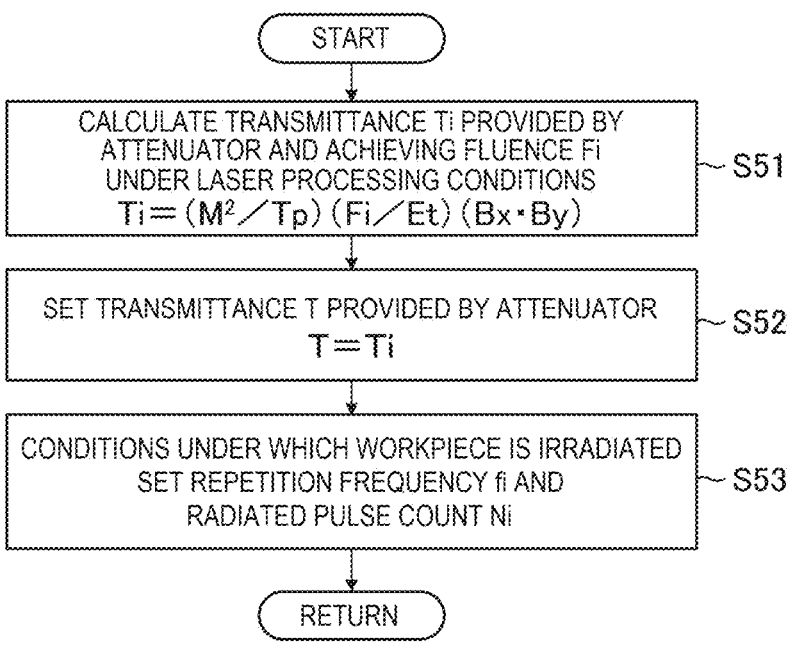
FIG. 12 is a flowchart showing an example of the content of the process of calculating and setting of control parameters for controlling a laser processing apparatus.

FIG. 12 is a flowchart showing an example of the content of the process of calculating and setting of the control parameters for controlling the laser processing apparatus 14. The flowchart shown in FIG. 12 is applied to step S16 in FIG. 9. In step S51 in FIG. 12, the laser processing control section 100 calculates transmittance Ti provided by the attenuator 120 and achieving the fluence Fi under the laser processing conditions.

The fluence at the surface of the workpiece is expressed by Expression (4) below.

$$F = M^{-2}(T \cdot Tp \cdot Et) \big/ (Bx \cdot By) \qquad (4)$$

M in Expression (4) represents the magnification of the projection optical system 142. M may range, for example, from ½ to ¼.

Tp in Expression (4) represents the transmittance provided by the optical system throughout the path along which the pulse laser light outputted from the laser apparatus 12 when the attenuator 120 provides the maximum transmittance reaches the workpiece 160.

Based on Expression (4), the transmittance Ti provided by the attenuator 120 is determined from Expression (5) below.

$$Ti = \big(M^2 \big/ Tp\big)(Fi / Et)(Bx \cdot By) \qquad (5)$$

In step S52, the laser processing control section 100 sets the transmittance T provided by the attenuator 120 at Ti. That is, the laser processing control section 100 controls the angles of the partially reflective mirrors 121 and 122 in such a way that the transmittance T provided by the attenuator 120 is equal to Ti.

Thereafter, in step S53, the laser processing control section 100 sets the repetition frequency fi, and the radiated pulse count Ni as the conditions of the laser light with which the workpiece 160 is irradiated. The laser processing control section 100 transmits the light emission trigger signal Tr to the laser apparatus 12 to set the laser apparatus 12 in such a way that the laser apparatus 12 can output pulse laser light having the repetition frequency fi and the radiated pulse count Ni.

After step S53, the laser processing control section 100 terminates the flowchart of FIG. 12 and returns to the main procedure in FIG. 9.

2.3 Problems

The laser processing system 10 is used as described above to transfer an image of the mask 140 onto the surface of the interlayer insulating layer 173, followed by ablation processing using KrF excimer laser light (having wavelength of 248 nm), resulting in the problem below.

Figure 13:
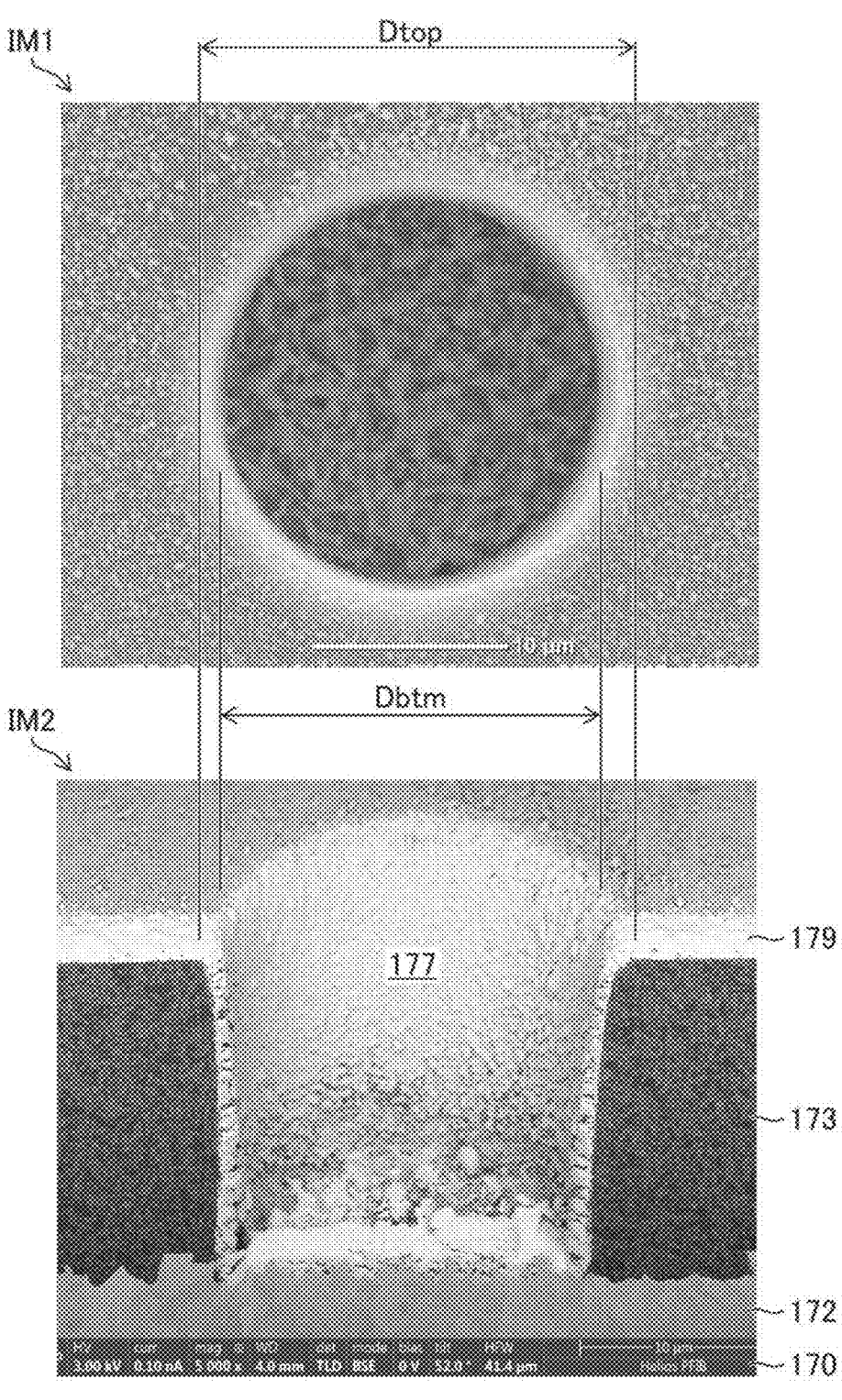
FIG. 13 is an image produced by observation of the processed surface and a cross section of a via hole produced under a focused ion beam apparatus.

FIG. 13 is an SEM (scanning electron microscope) image produced by observation of the processed surface and a cross section of the via hole 177 produced by the laser processing without the polymer compound layer 174. An image IM1 shown in the upper part of FIG. 13 is a surface SEM image produced by observation of the via hole 177 produced by the laser processing and observed from above. On the other hand, an image IM2 shown in the lower part of FIG. 13 is a cross-sectional SEM image of the via hole 177 produced by observation of a cross section of the via hole 177 under a focused Ion beam (FIB) apparatus.

A protective film 179 disposed at the top layer in the image IM2 is a protective film formed in advance at the surface of the interlayer insulating layer 173 to prevent the shape of the opening of the via hole 177 from deteriorating when the interlayer insulating layer 173 is cut. The protective film 179 is added onto the interlayer insulating layer 173 after the laser processing to allow the cross-sectional observation, and the protective film 179 is not present during the laser processing. In the image IM1 shown in the upper part of FIG. 13, the protective film 179 is not present because the observation target object is not cut.

In the case of the via hole processing shown in FIG. 13, a taper angle θb, which is calculated from the diameter Dtop of the opening at the processed surface of the interlayer insulating layer 173, the diameter Dbtm of the opening at the bottom surface of the interlayer insulating layer 173, and the thickness h of the interlayer insulating layer 173, is 87.0°, which is worse than an ideal taper angle of 90°.

Figures 14, 15:
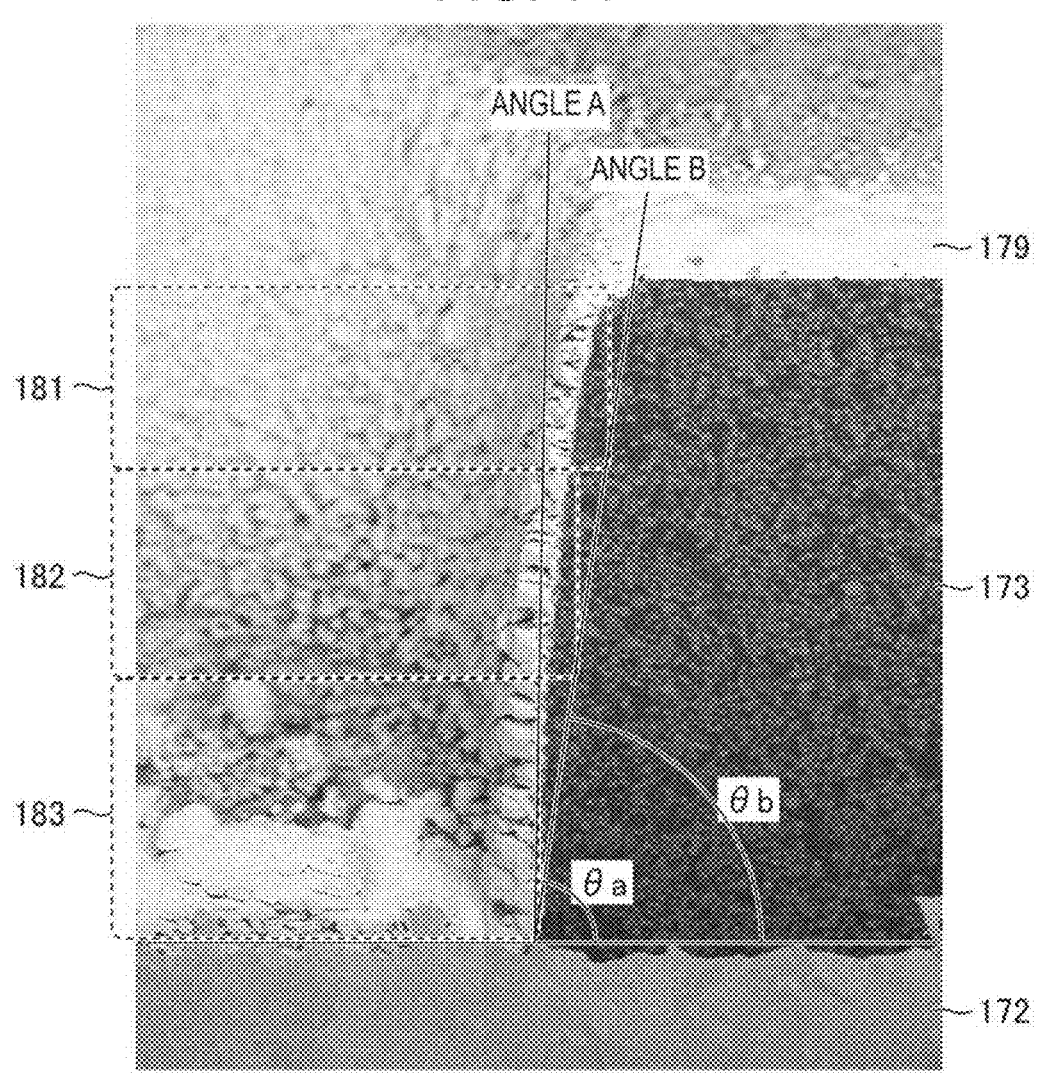
FIG. 14 is an enlarged view of the sidewall of the via hole shown in FIG. 13.
FIG. 15 is a table showing an example of the value of a taper angle θa at the bottom surface of the via hole measured in a cross-sectional image and the value of a taper angle θb calculated from a surface SEM image.

FIG. 14 is an enlarged view of the sidewall of the via hole 177 shown in FIG. 13. In FIG. 14, a taper angle θa at the bottom surface of the interlayer insulating layer 173 is an angle between a straight line drawn from the bottom surface of the interlayer insulating layer 173 along the slope of the sidewall of the via hole 177 and the bottom surface of the via hole 177 (principal surface of conductor layer 172), and the thus defined taper angle θa is measured in the cross-sectional image. A sidewall slope angle that is the taper angle θa measured in the cross-sectional image is called an "angle A".

On the other hand, the taper angle θb in FIG. 14 is an angle calculated from the top diameter Dtop and the bottom diameter Dbtm shown in FIG. 13. The sidewall slope angle that is the taper angle θb is called an "angle B".

FIG. 15 shows an example of the value of the taper angle θa measured at the bottom surface in the cross-sectional image and the value of the taper angle θb calculated from the surface SEM image. The taper angle θa at the bottom surface was 89.1°, while the taper angle θb calculated from the top diameter Dtop and the bottom diameter Dbtm was 87.0°.

The relationship between the taper angle θa at the bottom surface and the taper angle θb calculated from the top diameter Dtop and the bottom diameter Dbtm is θa>θb. As can be grasped from FIG. 14, due to the "sagging" in the vicinity of the surface of the interlayer insulating layer 173 on the side with which the laser light is irradiated, the taper angle θb (angle B) has deteriorated.

When the interlayer insulating layer 173 with the polymer compound layer 174 removed is irradiated with the excimer laser light, the laser ablation processing mode changes in the via hole 177. A processing target range in the vicinity of the surface of the interlayer insulating layer 173 is defined as a surface processing mode area 181, as shown in FIG. 14, which causes the "sagging". A processing target range in the vicinity of the conductor layer 172 is defined as an internal processing mode area 183, where the taper angle is relatively large. A processing target range between the surface processing mode area 181 and the internal processing mode area 183 is defined as a processing mode inflection area 182. The boundary position between the surface processing mode area 181 and the processing mode inflection area 182 is called an "inflection point". The slope of the sidewall of the via hole 177 greatly changes on opposite sides of the inflection point, the upper side (surface side) and the lower side (bottom side).

In the laser processing method according to Comparative Example described with reference to FIGS. 6 to 14, the angle B deteriorates because the surface processing mode area is created in the via hole 177.

3. First Embodiment

3.1 Configuration

The configuration of the laser processing system 10 that executes the laser processing method according to a first embodiment may be the same as the configuration shown in FIG. 4.

3.2 Operation

Figure 16:
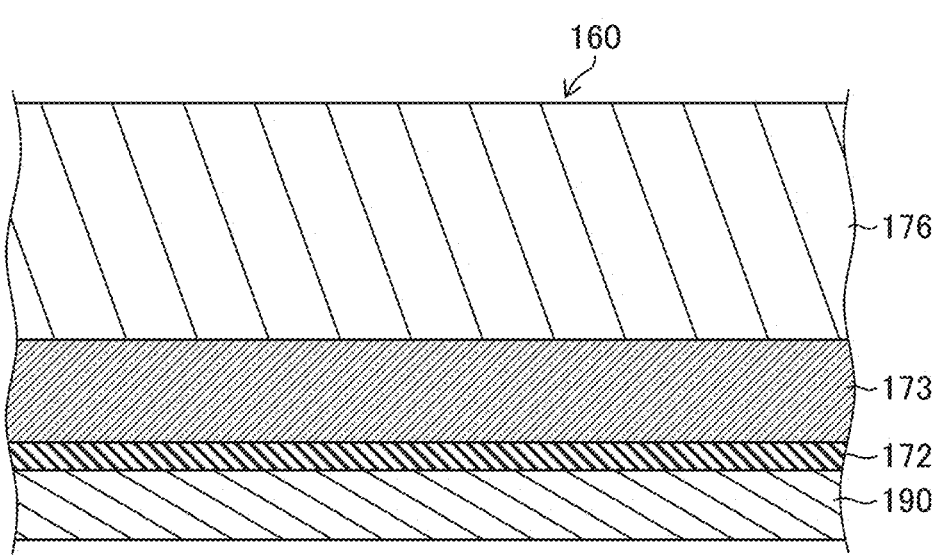
FIG. 16 is a cross-sectional view diagrammatically showing an example of the configuration of the circuit board as a workpiece.

The laser processing method according to the first embodiment will be described with reference to FIGS. 16 to 18. FIG. 16 is a cross-sectional view diagrammatically showing an example of the configuration of a circuit board 190 as the workpiece 160. The conductor layer 172, the interlayer insulating layer 173, and a sacrificial layer 176 are laminated on the circuit board 190, or the circuit board 190 is coated therewith. The circuit board 190 is an inner layer substrate, and the conductor layer 172 is formed on the circuit board 190 so as to cover part of the principal surface of the circuit board 190. The sacrificial layer 176 may be the polymer compound layer 174. The interlayer insulating layer 173 may have a thickness of, for example, 20 μm. The sacrificial layer 176 may have a thickness of, for example, 40 μm.

Figure 17:
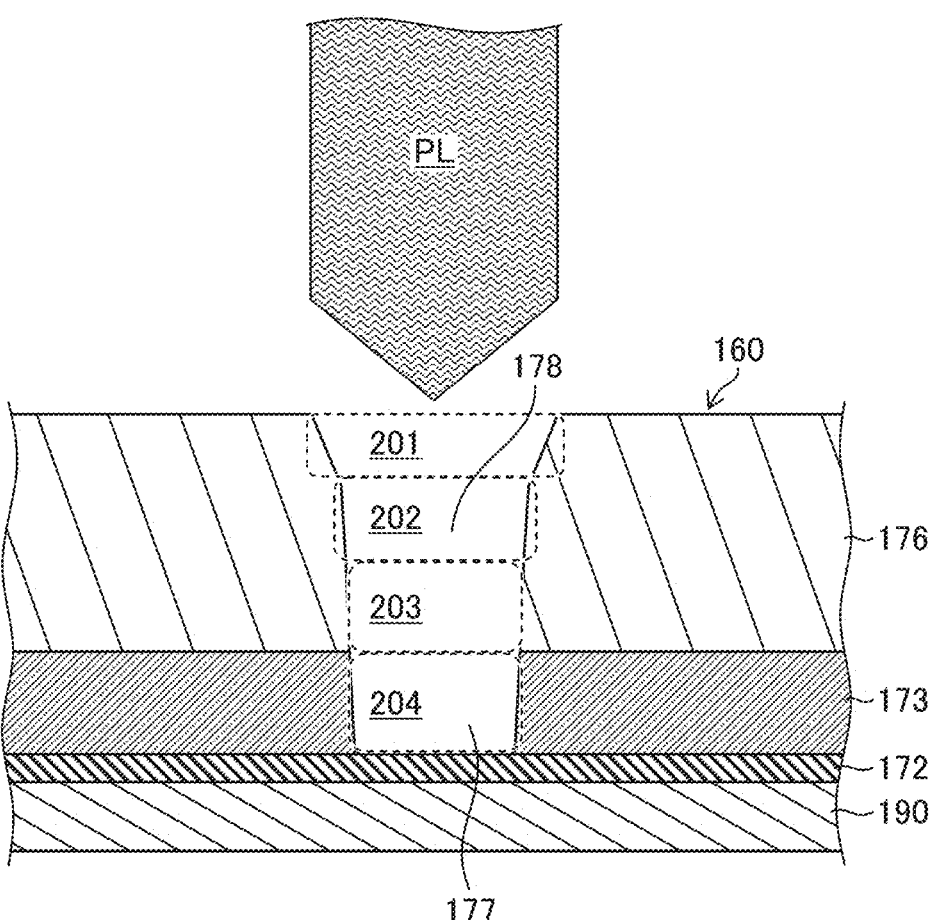
FIG. 17 is a cross-sectional view showing the laser ablation processing using ultraviolet pulse laser light.

FIG. 17 is a cross-sectional view showing the laser ablation processing using the ultraviolet pulse laser light PL. An image of the mask 140 is transferred via the projection optical system 142 onto the workpiece 160 having the stacked structure, in which the conductor layer 172, the interlayer insulating layer 173, and the sacrificial layer 176 are stacked in this order on the circuit board 190, from the side facing the sacrificial layer 176, which is laminated on the workpiece 160 or with which the workpiece 160 is coated, with the sacrificial layer 176 left, so that the workpiece 160 is irradiated with the pulse laser light PL. The position where the transferred image of the mask 140 is formed is preferably between the surface (exposed surface)

of the sacrificial layer 176 and the interface between the sacrificial layer 176 and the interlayer insulating layer 173, more preferably in the vicinity of the boundary between the sacrificial layer 176 and the interlayer insulating layer 173.

The sacrificial layer 176 and the interlayer insulating layer 173 are irradiated with the pulse laser light PL at a high repetition frequency until the laser ablation processing exposes the conductor layer 172, and a very small tubular opening called the via hole 177 is formed in the interlayer insulating layer 173. A through hole 178 is formed in the sacrificial layer 176 by the radiation of the pulse laser light PL onto the sacrificial layer 176, and the via hole 177 is formed by the radiation of the pulse laser light PL onto the interlayer insulating layer 173 via the through hole 178.

As the drilling of a hole progresses from the surface of the sacrificial layer 176 toward the conductor layer 172, the laser ablation processing mode changes in the sacrificial layer 176. A surface processing mode area 201, a processing mode inflection area 202, and an internal processing mode area 203 are formed in the through hole 178 formed in the sacrificial layer 176. On the other hand, an internal processing mode area 204 is formed in the via hole 177 in the interlayer insulating layer 173. The sacrificial layer 176 is an example of a "first sacrificial layer" in the present disclosure. The through hole 178 is an example of a "first through hole" in the present disclosure. The interlayer insulating layer 173 is an example of an "insulating layer" and a "first insulating layer" in the present disclosure. The via hole 177 is an example of an "opening" and a "first via hole" in the present disclosure.

Figure 18:
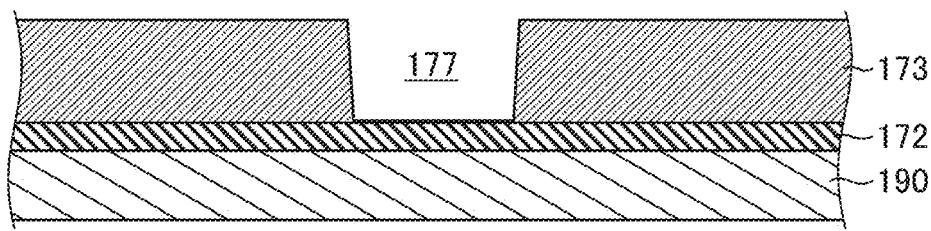
FIG. 18 is a cross-sectional view showing the state in which a sacrificial layer is removed after the laser ablation processing.

FIG. 18 is a cross-sectional view showing the state in which the sacrificial layer 176 is removed after the laser ablation processing. The sacrificial layer 176, which has been laminated on the interlayer insulating layer 173 or with which the sacrificial layer 176 is coated, is removed after the laser ablation processing described with reference to FIG. 17. To remove the sacrificial layer 176, the sacrificial layer 176 may be peeled off or etched away.

The steps of the laser processing method according to the first embodiment are summarized below.

Step 1: The workpiece 160 having a stacked structure, such as that shown in FIG. 16, is prepared.

Step 2: With the interlayer insulating layer 173 covered with the sacrificial layer 176, the pulse laser light PL is radiated onto the sacrificial layer 176 to perform the ablation processing, as shown in FIG. 17.

Step 3: After the laser ablation processing, the sacrificial layer 176 is removed, as shown in FIG. 18.

3.3 Example of Result of Processing

The KrF excimer laser light is radiated by forming the image of the mask 140 in the vicinity of the surface of the interlayer insulating layer 173 to form a via hole.

FIG. 19 is a table showing a summary of the result of the via hole processing using the laser processing method according to Comparative Example and the result of the via hole processing using the laser processing method according to the first embodiment. The left side of FIG. 19 shows the result of the processing using the laser processing method according to Comparative Example, and the right side of FIG. 19 shows the result of the processing using the laser processing method according to the first embodiment.

The laser processing method according to Comparative Example is a processing method for radiating the pulse laser light onto the interlayer insulating layer 173 in the absence of the polymer compound layer 174, that is, in the absence of the sacrificial layer.

The surface SEM image and the cross-sectional SEM image of the via hole produced by the laser processing method according to Comparative Example are the images IM1 and IM2 shown in FIG. 13.

In contrast, the laser processing method according to the first embodiment may cause "sagging" to occur in the vicinity of the surface of the sacrificial layer 176 to be removed after the laser radiation, but allows the interlayer insulating layer 173 to be the internal processing mode area 204.

As a result, the taper angle θb calculated from the diameter at the surface of the via hole (top diameter) and the diameter at the bottom of the via hole (bottom diameter) improves from 87.0° in Comparative Example to 87.9° in the first embodiment.

Figure 20:
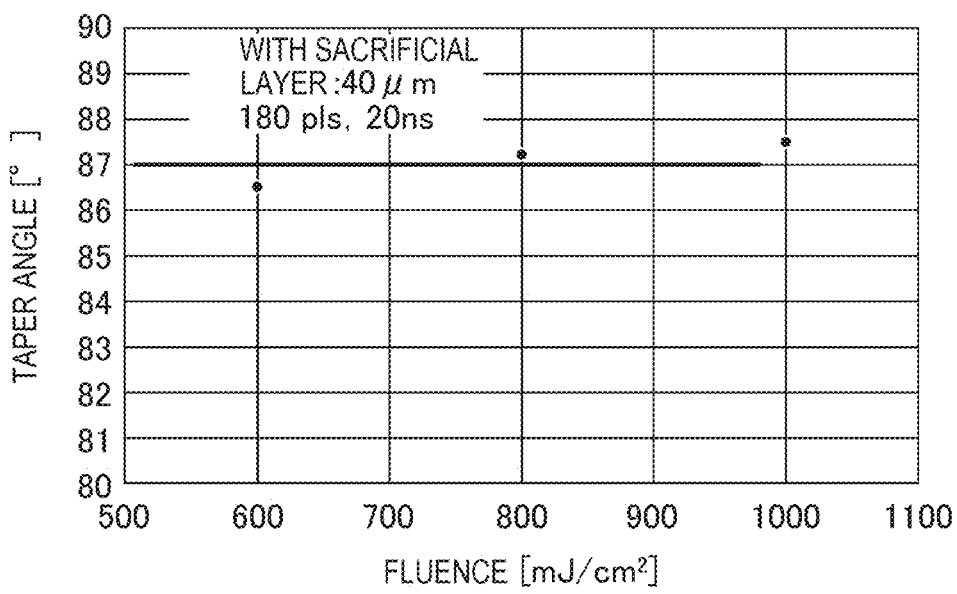
FIG. 20 is a graph showing the relationship between the fluence and the taper angle in the laser processing method according to the first embodiment.
Figure 21:
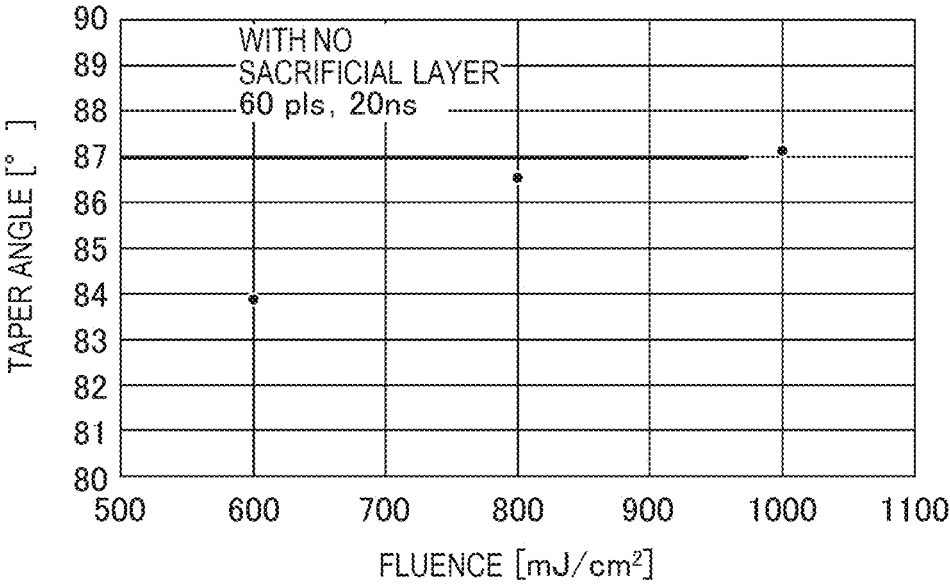
FIG. 21 is a graph showing the relationship between the fluence and the taper angle in the laser processing method according to Comparative Example.

FIG. 20 is a graph showing the relationship between the fluence and the taper angle in the laser processing method according to the first embodiment. FIG. 21 is a graph showing the relationship between the fluence and the taper angle in the laser processing method according to Comparative Example. FIGS. 20 and 21 show the taper angle of the via hole processed with the fluence of the pulse laser light set at 600 mJ/cm², 800 mJ/cm², and, 1,000 mJ/cm². The graphs each show a line representing a taper angle of 87° as a guide.

Comparison between FIGS. 20 and 21 clearly shows that the laser processing method according to the first embodiment shown in FIG. 20 allows a taper angle greater than the taper angle that can be achieved in Comparative Example (FIG. 21) even when the fluence of the pulse laser light is reduced. In the first embodiment, in particular, even when the fluence is 800 mJ/cm², a taper angle greater than 87° is achieved, and even when the fluence is further reduced to 600 mJ/cm², a taper angle of 86.5° is achieved. The first embodiment provides a fluence reduction effect. In the laser processing method according to the first embodiment, the fluence of the pulse laser light during the processing preferably ranges, for example, from 600 mJ/cm² to 1000 mJ/cm², more preferably, from 800 mJ/cm² to 1000 mJ/cm².

Figure 22:
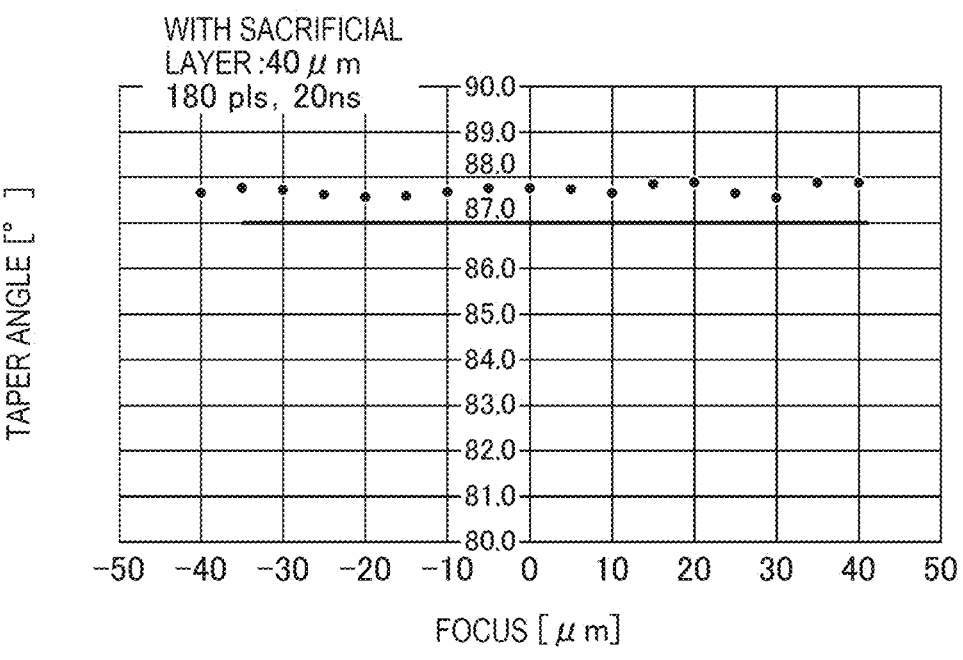
FIG. 22 is a graph showing the relationship between the focus position and the taper angle in the laser processing method according to the first embodiment.
Figure 23:
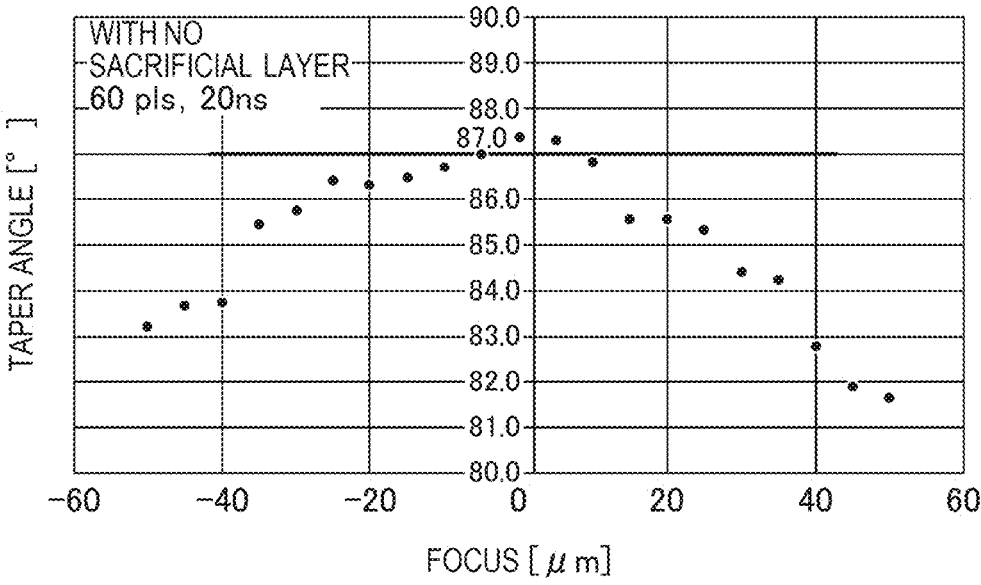
FIG. 23 is a graph showing the relationship between the focus position and the taper angle in the laser processing method according to Comparative Example.

FIG. 22 is a graph showing the relationship between the focus position and the taper angle in the laser processing method according to the first embodiment. FIG. 23 is a graph showing the relationship between the focus position and the taper angle in the laser processing method according to Comparative Example. In FIGS. 22 and 23, the horizontal axis represents the focus position in the Z-axis direction. The origin of the horizontal axis is the upper surface of the interlayer insulating layer 173.

Comparison between FIGS. 22 and 23 clearly shows that the laser processing method according to the first embodiment provides the effect of suppressing variation in the taper angle due to variation in the depth of focus.

Figure 24:
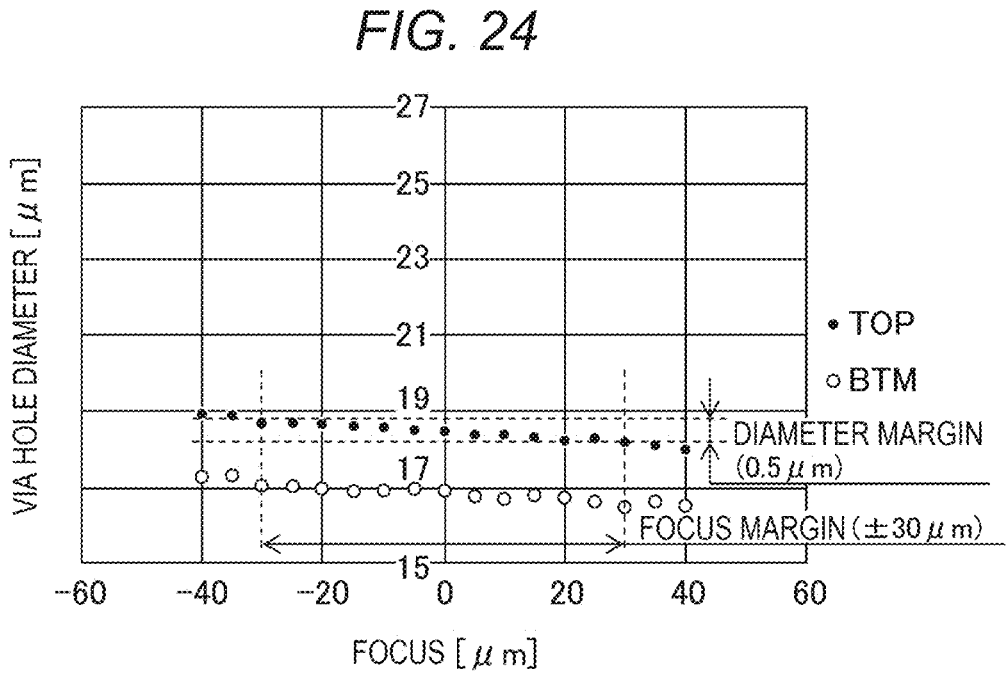
FIG. 24 is a graph showing the relationship between the focus position and the via hole diameter in the laser processing method according to the first embodiment.
Figure 25:
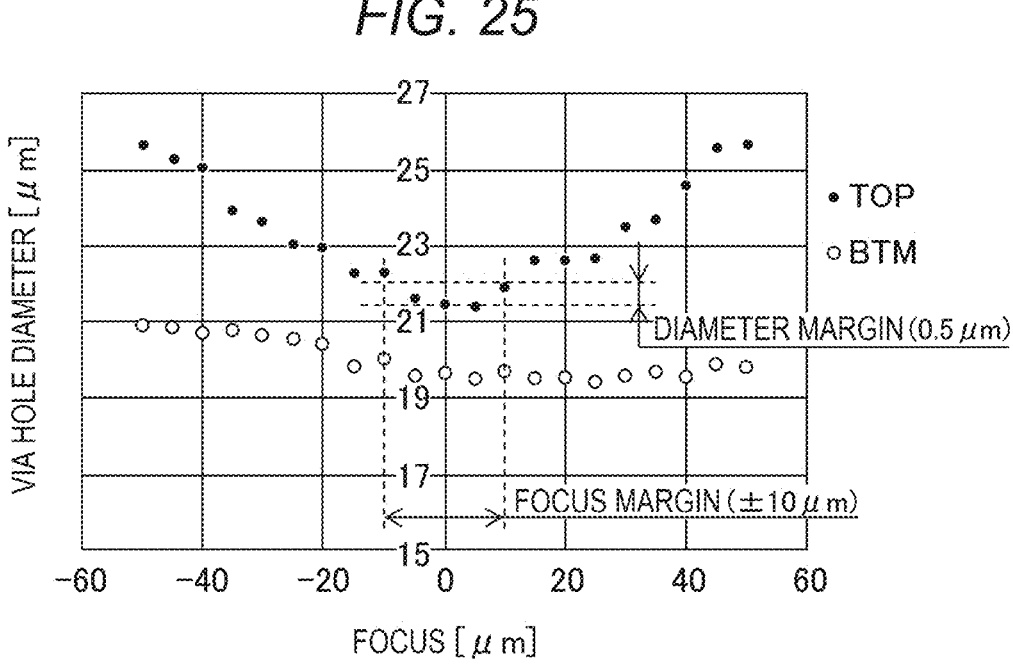
FIG. 25 is a graph showing the relationship between the focus position and the via hole diameter in the laser processing method according to Comparative Example.

FIG. 24 is a graph showing the relationship between the focus position and the via hole diameter in the laser processing method according to the first embodiment. FIG. 25 is a graph showing the relationship between the focus position and the via hole diameter in the laser processing method according to Comparative Example. FIGS. 24 and 25 show the relationship of the top and bottom diameters with the focus position in the form of graphs. In FIGS. 24 and 25, "TOP" represents the top diameter, and "BTM" represents the bottom diameter. In the case of the laser processing method according to Comparative Example shown in FIG. 25, the top diameter greatly varies due to variation in the focus. In contrast, the variation in diameters except for the top diameter, such as the bottom diameter, is small against the variation in the focus. A conceivable reason why the taper angle deteriorates due to the variation in the focus in Comparative Example is primarily that the top diameter varies, as shown in FIG. 23, which has been already described.

In contrast, in the laser processing method according to the first embodiment, the variation in both the top and bottom diameters is small against the variation in the focus, as shown in FIG. 24.

Comparison between FIGS. 24 and 25 shows that, in the laser processing method according to the first embodiment, the variation in the top diameter due to the variation in the focus is smaller than that in Comparative Example. That is, in Comparative Example shown in FIG. 25, when the margin of the top diameter is set at 0.5 μm with respect to the top diameter at the focus of zero, the margin of the depth of focus is ±10 μm, whereas in the first embodiment shown in FIG. 24, when the margin of the top diameter is also set at 0.5 μm, the focus margin is ±30 μm, showing that the focus margin is three times greater, so that the processing accuracy is higher in the first embodiment.

According to the first embodiment, the diameter of the processed hole is smaller than that in Comparative Example, provided that the same mask 140 is used. A diameter Di of the transferred image of the mask 140 at the upper surface of the interlayer insulating layer 173 is 21.5 μm, whereas a diameter Dm of the transferred image of the mask 140 at the processed surface is 18.2 μm. Let ΔD=Di−Dm be the amount of change due to the processing, the amount of change ΔD due to the processing is 21.5−18.2=3.3 in the first embodiment. The mask pattern may be designed to achieve a target diameter of a processed hole (target hole diameter) in anticipation of the amount of change ΔD due to the processing.

The diameter of the processed via hole 177 formed by using the laser processing method according to the first embodiment may range, for example, from 3 μm to 20 μm.

3.4 Effects

The laser processing method according to the first embodiment provides the following improvements as compared with the laser processing method according to Comparative Example.

[1] The taper angle θb determined from the surface diameter (top diameter) and the diameter at the bottom (bottom diameter) of the via hole improves from 87.0° in Comparative Example to 87.9° in the first embodiment.

[2] The threshold used in the via hole processing decreases. That is, the effect of reducing the fluence required for the processing is provided.

[3] In the laser processing with the sacrificial layer 176 provided as in the first embodiment, in which the sacrificial layer 176 is removed after the laser processing, debris having adhered to the sacrificial layer 176 is removed along with the sacrificial layer 176, whereby adhesion of the debris to the vicinity of the via hole can be suppressed.

[4] The effect of suppressing variation in the taper angle due to the variation in the depth of focus is provided.

3.5 Assumption Principle

In the laser processing method according to the first embodiment, the process is considered to proceed in the order of processing steps 1 to 3 below.

[Processing Step 1]

Figure 26:
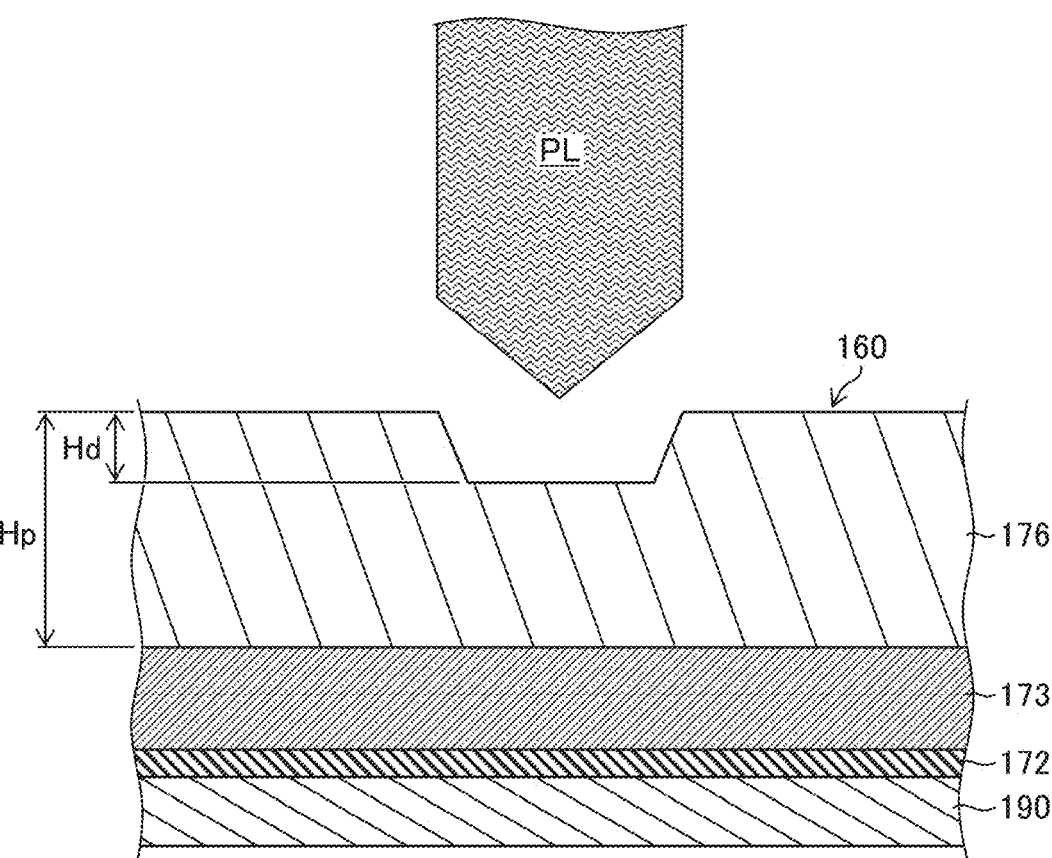
FIG. 26 is a cross-sectional view diagrammatically showing a processing step 1 in the laser processing method according to the first embodiment.

FIG. 26 is a cross-sectional view diagrammatically showing the processing step 1 in the laser processing method according to the first embodiment. The processing step 1 is the process of forming a tapered (sagging) portion having a small taper angle in the vicinity of the surface of the sacrificial layer 176, which is laminated on the workpiece 160 or with which the workpiece 160 is coated, in the laser ablation processing.

A thickness Hp of the sacrificial layer 176 is preferably at least greater than or equal to a thickness Hd, over which the tapered (sagging) portion having a small taper angle is formed (Hd≤Hp).

Fluence Fp, which is the threshold used in the processing of the sacrificial layer 176, is preferably smaller than or equal to fluence Fa, which is the threshold used in the processing of the interlayer insulating layer 173 (Fp≤Fa).

[Processing Step 2]

Figure 27:
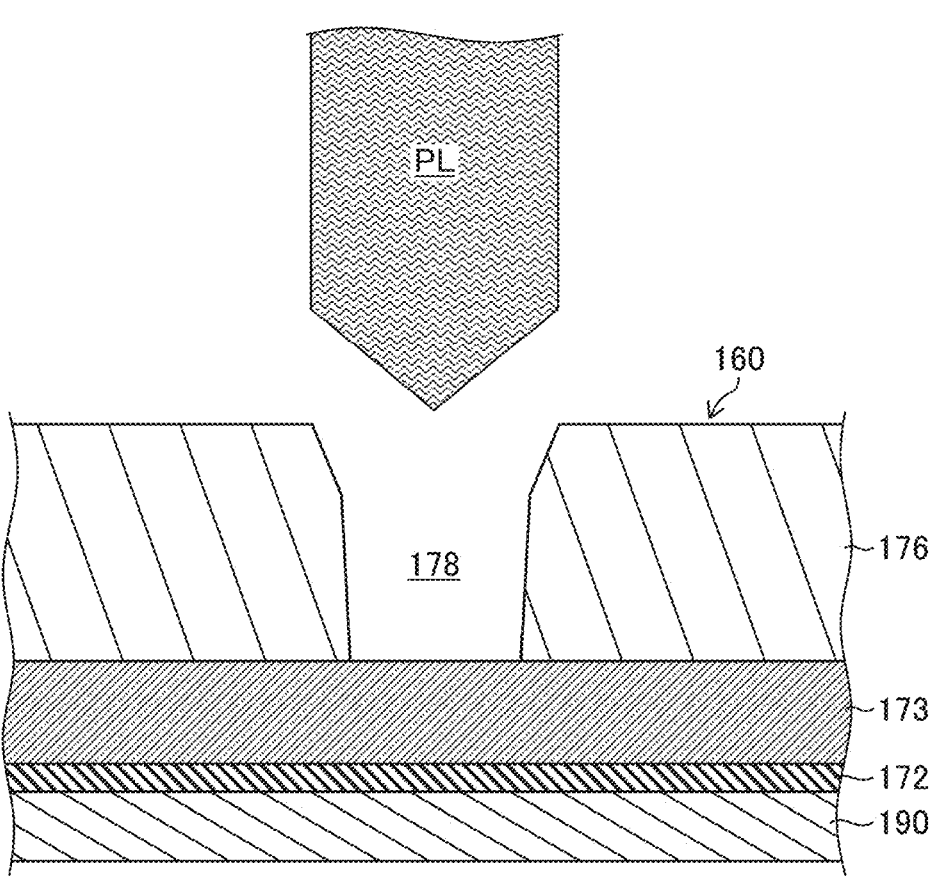
FIG. 27 is a cross-sectional view diagrammatically showing a processing step 2 in the laser processing method according to the first embodiment.

FIG. 27 is a cross-sectional view diagrammatically showing the processing step 2 in the laser processing method according to the first embodiment. The processing step 2 is the process of performing the laser ablation processing using self-convergence of the pulse laser light PL in the sacrificial layer 176.

It is believed that self-convergence of the pulse laser light PL occurs due to the reflection of the pulse laser light PL off the sidewall of the through hole 178 processed in the sacrificial layer 176. The self-convergence effect increases the fluence during the drilling of the through hole.

[Processing Step 3]

Figure 28:
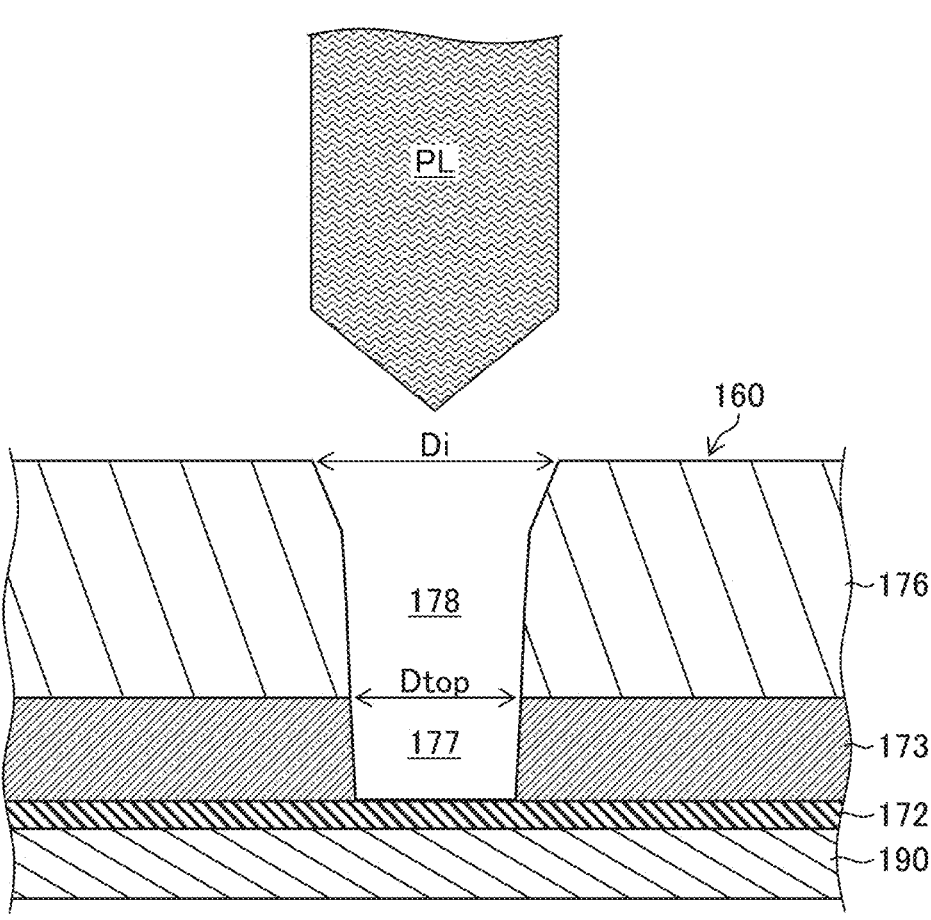
FIG. 28 is a cross-sectional view diagrammatically showing a processing step 3 in the laser processing method according to the first embodiment.

FIG. 28 is a cross-sectional view diagrammatically showing the processing step 3 in the laser processing method according to the first embodiment. The processing step 3 is the process of performing the laser ablation processing on the interlayer insulating layer 173 by using the pulse laser light PL having converged.

The diameter Dtop of the processed hole (top diameter) on the light incident side of the interlayer insulating layer 173 is smaller than the diameter Di of the transferred image of the mask 140 transferred onto the upper surface of the sacrificial layer 176 (imaging beam diameter), so that the relationship Di>Dtop is achieved. The difference between the diameter Di of the imaging beam and the diameter Dtop of the processed hole (Di−Dtop) is the amount of change ΔD due to the processing.

3.6 Thickness of Sacrificial Layer

Figure 29:
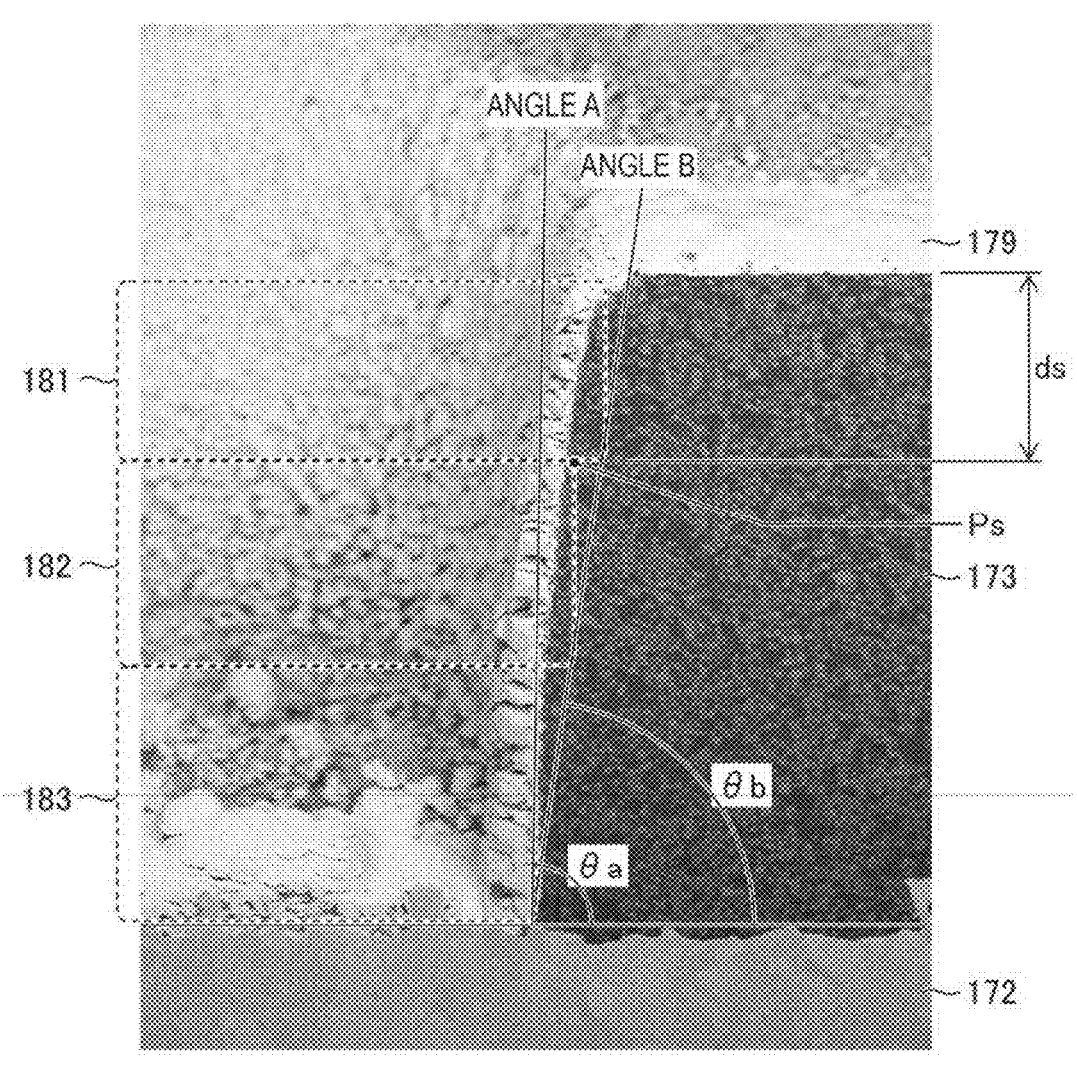
FIG. 29 is a cross-sectional SEM image produced when the via hole processing is performed by irradiating the interlayer insulating layer without a sacrificial layer with the pulse laser light.

The thickness of the sacrificial layer 176 is preferably greater than or equal to the thickness of the surface processing mode area 181. To examine the required thickness of the sacrificial layer 176, the cross-sectional SEM image shown in FIG. 29 is studied. FIG. 29 is a cross-sectional SEM image produced when the via hole processing is performed by irradiating the interlayer insulating layer 173 without a sacrificial layer with the pulse laser light. The thickness of the interlayer insulating layer 173 in the cross-sectional SEM image shown in FIG. 29 is 20 µm, and a distance ds from the surface of the interlayer insulating layer 173 to an inflection point Ps at the boundary between the surface processing mode area 181 and the processing mode inflection area 182 is calculated as 5.7 µm. The value was obtained by identifying the position of the inflection point Ps in the SEM image and measuring the distance ds from the surface of the interlayer insulating layer 173 to the inflection point Ps in the cross-sectional SEM image.

When the sacrificial layer 176 is made of a material that exhibits processing phenomenon behavior similar to that of the interlayer insulating layer 173, the required thickness of the sacrificial layer 176 is considered to be about 5.7 µm. The required thickness of the sacrificial layer 176 is greater than or equal to the distance from the surface of the sacrificial layer 176 to the inflection point Ps at the sidewall of the through hole 178.

The thickness of the sacrificial layer 176 may range, for example, from 5.7 µm to 40 µm, preferably, ranges from 7 µm to 20 µm.

3.7 Amount of Shift of Diameter of Processed Hole

Figure 30:
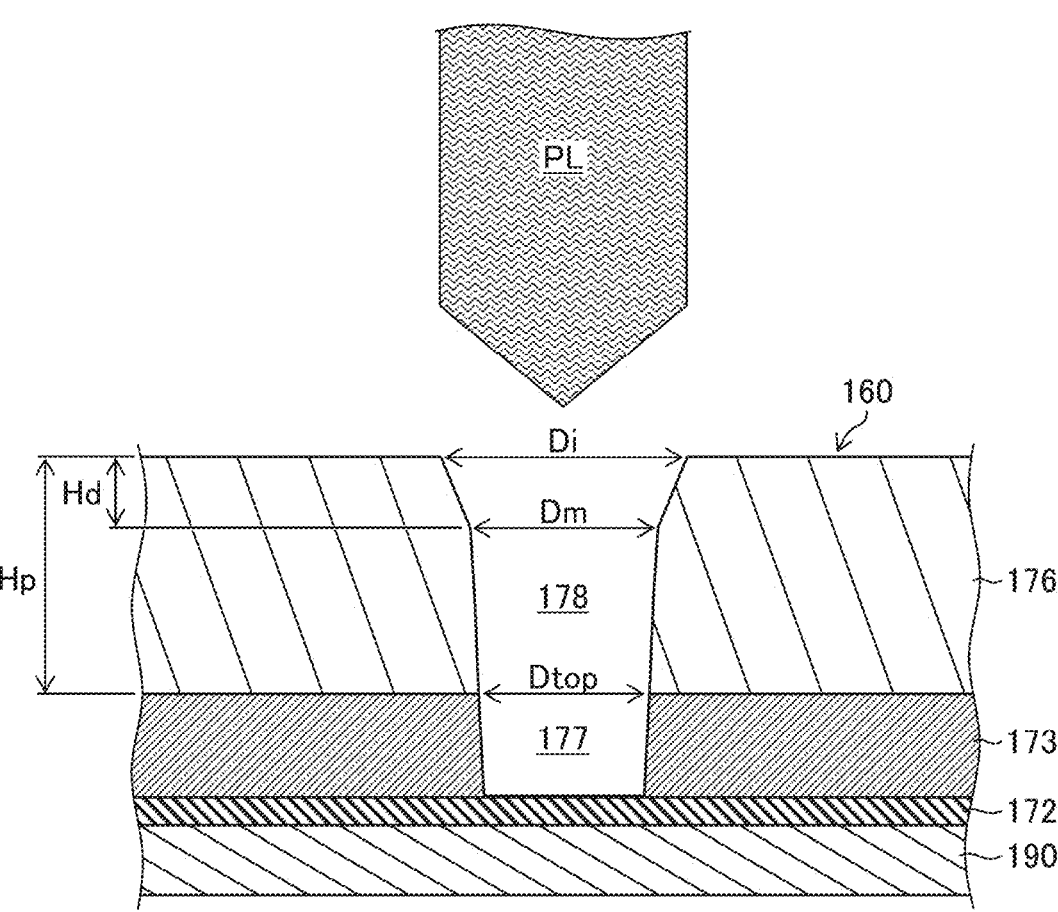
FIG. 30 is a cross-sectional view diagrammatically showing the state of the processing in the laser processing method according to the first embodiment.

FIG. 30 is a cross-sectional view diagrammatically showing the state of the processing in the laser processing method according to the first embodiment. For example, when the thickness Hp of the sacrificial layer 176 is 40 µm, and the thickness Hd of the sagging portion is 5.7 µm, the diameter Di of the imaging beam is 21.5 µm and the top diameter Dtop is 18.2 µm under the radiation conditions that the fluence of the pulse laser beam is 1000 mJ/cm². In this case, the amount of change (amount of shift) due to the processing is ΔD=Di−Dtop=21.5−18.2=3.3 µm.

Let Dtop be a target via hole diameter, and assume that the amount ΔD of change due to the processing is fixed, the imaging beam diameter Di is expressed by the expression below.

$$Di = Dtop + \Delta D \tag{6}$$

When the thickness Hp of the sacrificial layer 176 is 40 µm, ΔD=3.3 µm.

The amount ΔD of change due to the processing is expressed by the expression below.

$$\Delta D = (Di - Dm) + (Dm - Dtop) = 3.3 \tag{7}$$

Dm−Dtop is expressed by Expression (8) below from Expressions (1) and (2).

$$Dm - Dtop = 2(Hp - Hd)/\tan\theta b \tag{8}$$

Substituting Hd=5.7 µm, Hp=40 µm, and θb=87.9° into Expression (8) yields the expression below.

$$Dm - Dtop = 2(40 - 5.7)/\tan(87.9°) = 2.5$$

Substituting the value into Expression (7) yields Expression (9).

$$\Delta D = (Di - Dm) + 2.5 = 3.3 \tag{9}$$

If the thickness Hd of the sacrificial layer 176 is 5.7 µm, then Dm−Dtop is 0, so that ΔD=Di−Dm=3.3−2.5=0.8 µm from Expression (7).

FIG. 31 is a graph showing the relationship between a target hole diameter Dt and the imaging beam diameter Di. FIG. 32 is a table showing original data based on which the graph shown in FIG. 31 is drawn. FIG. 32 shows data in the cases where the sacrificial layer 176 has the thicknesses of 5.7 μm and 40 μm. The values shown in FIG. 32 are expressed in micrometers [μm].

The relationship between Di and Dt in the case where the thickness of the sacrificial layer 176 is 5.7 μm is expressed by an expression Di=Dt+0.8, as shown in FIG. 31. The relationship between Di and Dt in the case where the thickness of the sacrificial layer 176 is 40 μm is expressed by an expression Di=Dt+3.3.

When the thickness of the sacrificial layer 176 ranges from 5.7 μm to 40 μm, any amount of correction of the imaging beam diameter Di in consideration of the amount ΔD of change due to the processing falls within the area sandwiched between the two straight lines of the graph. The amount ΔD of change due to the processing depends on the thickness of the sacrificial layer 176. The imaging beam diameter Di corresponding to the target hole diameter Dt can be determined from the graph shown in FIG. 31.

4. Second Embodiment

4.1 Configuration

The configuration of the laser processing system 10 using the laser processing method according to a second embodiment may be the same as the configuration shown in FIG. 1.

4.2 Operation

The laser processing method according to the second embodiment will be described with reference to FIGS. 33 to 37. In FIGS. 33 to 37, the same element as an element in the configuration described with reference to FIGS. 16 to 18 has the same reference character, and no duplicated description of the same element will be made.

Figure 33:
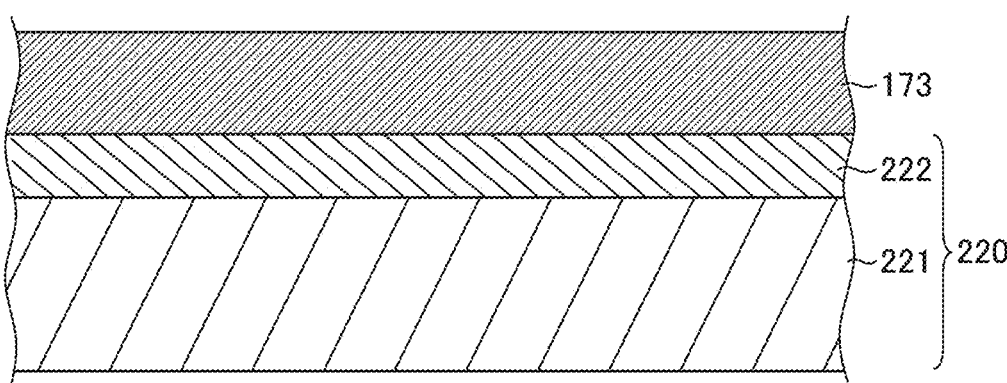
FIG. 33 is a cross-sectional view diagrammatically showing an example of the configuration of the interlayer insulating layer used in the second embodiment.

FIG. 33 is a cross-sectional view diagrammatically showing an example of the configuration of the interlayer insulating layer 173 used in the second embodiment. The thinner the sacrificial layer 176 is, the fewer radiated pulse count of the pulse laser light is. A thin sacrificial layer 176, however, causes deterioration of the flatness thereof, difficulty in lamination onto the circuit board 190, and other problems.

In the second embodiment, a polymer compound layer 220, which is superimposed on the interlayer insulating layer 173, is formed of two layers. That is, the polymer compound layer 220 has a stacked structure including a first polymer compound layer 221 and a second polymer compound layer 222, and the first polymer compound layer 221 is removed during the laser radiation.

The first polymer compound layer 221 is used as a base, and the second polymer compound layer 222 and the interlayer insulating layer 173 are laminated on the first polymer compound layer 221 so as to cover the first polymer compound layer 221, or the first polymer compound layer 221 is coated and covered with the second polymer compound layer 222 and the interlayer insulating layer 173, as shown in FIG. 33. The first polymer compound layer 221 and the second polymer compound layer 222 may, for example, each be a PET layer. The second polymer compound layer 222 may be thinner than the first polymer compound layer 221. That is, from the viewpoint of ensuring the flatness of the interlayer insulating layer 173 and facilitating the handling of the entire structure, the first polymer compound layer 221 may be thicker than the second polymer compound layer 222. The first polymer compound layer 221 is an example of the "support layer" in the present disclosure. The second polymer compound layer 222 is an example of a "sacrificial layer" and a "first sacrificial layer" in the present disclosure. The stacked structure shown in FIG. 33 is an example of a "first stacked structure" in the present disclosure.

Figure 34:
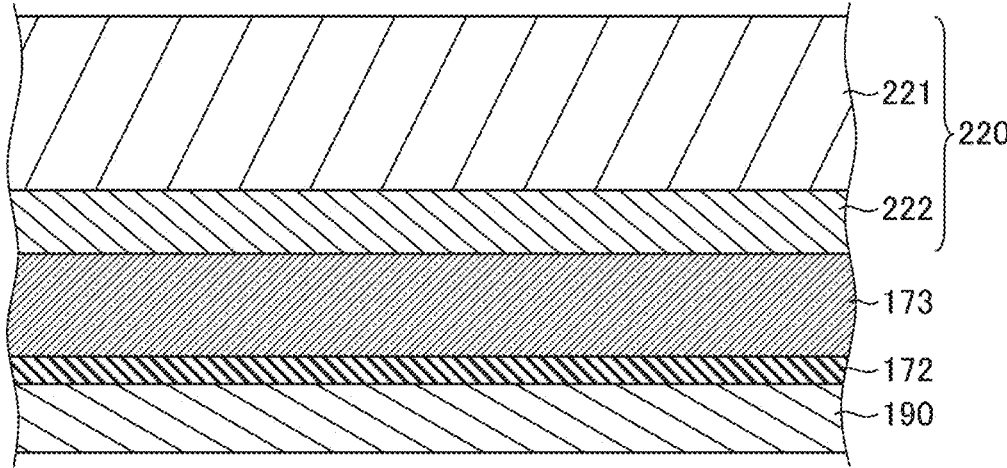
FIG. 34 is a cross-sectional view exemplarily showing the structure of the circuit board before the via hole processing.

FIG. 34 is a cross-sectional view exemplarily showing the structure of the circuit board 190 before the via hole processing. The conductor layer 172 is formed on the circuit board 190, the stacked structure described with reference to FIG. 33 is flipped upside down so as to cover the conductor layer 172, and the interlayer insulating layer 173 is laminated on the conductor layer 172, or the conductor layer 172 is coated with the interlayer insulating layer 173, as shown in FIG. 34. The stacked structure shown in FIG. 34 is an example of the "second stacked structure" in the present disclosure.

Figure 35:
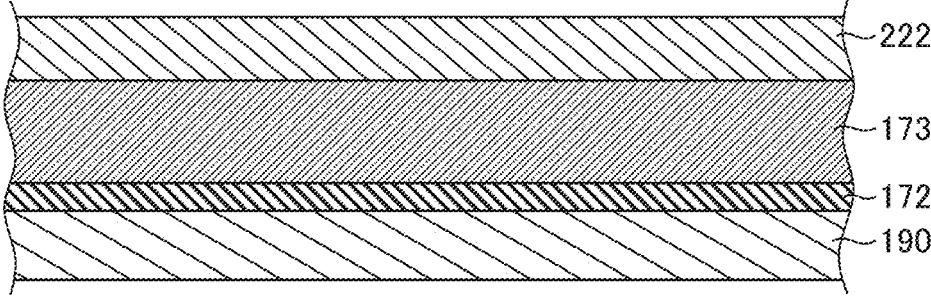
FIG. 35 is a cross-sectional view showing the state in which a first polymer compound layer has been removed from the state shown in FIG. 34.

FIG. 35 is a cross-sectional view showing the state in which the first polymer compound layer 221 has been removed from the state shown in FIG. 34. The first polymer compound layer 221 is removed from the state shown in FIG. 34 to expose the second polymer compound layer 222, as shown in FIG. 35.

Figure 36:
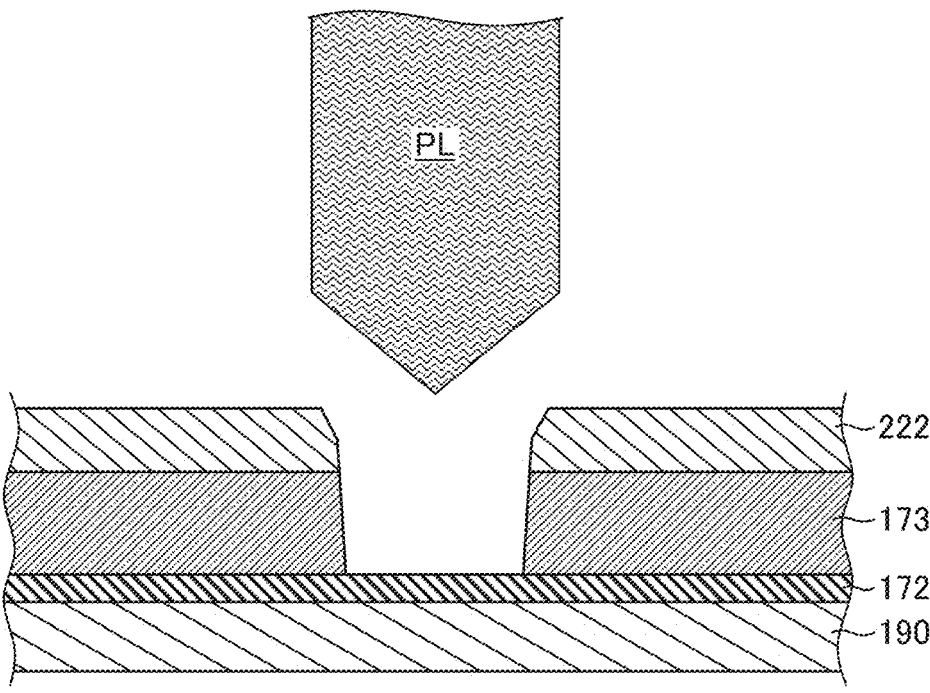
FIG. 36 is a cross-sectional view showing the laser ablation processing using the ultraviolet pulse laser light.

FIG. 36 is a cross-sectional view showing the laser ablation processing using the ultraviolet pulse laser light PL. From the side on which the second polymer compound layer 222 is laminated, or from the side coated with the second polymer compound layer 222, the pulse laser light PL is radiated by transferring the image of the mask 140 via the projection optical system 142. The position where the transferred image of the mask 140 is formed is preferably in the vicinity of the boundary between the second polymer compound layer 222 and the interlayer insulating layer 173.

Figure 37:
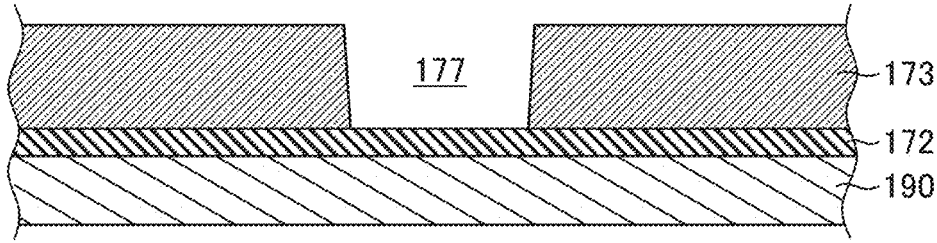
FIG. 37 is a cross-sectional view showing the state in which a second polymer compound layer has been removed after the laser ablation processing.

FIG. 37 is a cross-sectional view showing the state in which the second polymer compound layer 222 has been removed after the laser ablation processing. The second polymer compound layer 222, which has been laminated on the interlayer insulating layer 173 or with which the interlayer insulating layer 173 is coated, is removed after the laser ablation processing described with reference to FIG. 36. The second polymer compound layer 222 may be peeled off or etched away.

4.3 Effects

According to the second embodiment, when the polymer compound layer 220 is laminated onto the circuit board 190, the polymer compound layer 220 has a two-layer structure, and at the time of the laser radiation, the polymer compound layer 220 has one layer, the second polymer compound layer 222. The entire structure is therefore handled in an improved manner with the radiated pulse count of the pulse laser light PL suppressed.

5. Third Embodiment

5.1 Configuration

The configuration of the laser processing system 10 using the laser processing method according to a third embodiment may be the same as the configuration shown in FIG. 4.

5.2 Operation

The laser processing method according to the third embodiment will be described with reference to FIGS. 38 to 45. In FIGS. 38 to 45, the same element as an element in the configuration described with reference to FIGS. 16 to 18 has the same reference character, and no duplicated description of the same element will be made. In the third embodiment, a method for manufacturing a multilayer circuit board will be presented by way of example.

The method for manufacturing a multilayer circuit board includes a first via hole formation step, a seed layer formation step, a photoresist formation step, a conductor layer formation step, a first land formation step, a second interlayer insulating layer and sacrificial layer formation step, a second via hole formation and sacrificial layer removal step, and a second land formation step.

Figure 38:
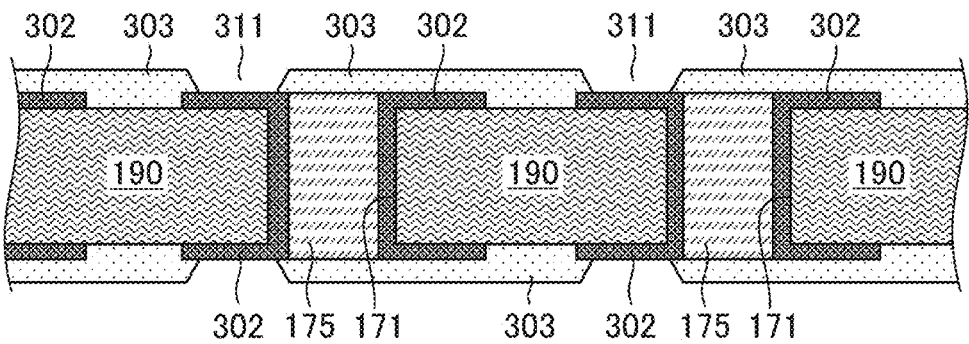
FIG. 38 is a cross-sectional view showing an example of a first via hole formation step.

FIG. 38 is a cross-sectional view showing an example of the first via hole formation step. The through holes 171, which pass through the opposite surfaces of the circuit board 190, are formed therein, and a first conductor layer 302, which allows conduction between the opposite surfaces of the circuit board 190, is formed at the inner wall of each of the through holes 171 and therearound. Furthermore, first interlayer insulating layers 303 are formed so as to cover the first conductor layers 302 and the circuit board 190. The first conductor layers 302 and the first interlayer insulating layers 303 are elements corresponding to the conductor layers 172 and the interlayer insulating layers 173 having been described. The first interlayer insulating layers 303 are an example of the "insulating layer" and the "first insulating layer" in the present disclosure.

First via holes 311 are formed in the first interlayer insulating layers 303 by executing the same laser processing method according to the first embodiment. That is, the first via holes 311 are formed by irradiating a sacrificial layer that is not shown with the ultraviolet pulse laser light. The first via holes 311 correspond to the via holes 177 having been described. FIG. 38 shows the state in which the sacrificial layer has been removed after the via hole processing.

FIG. 38 shows that the first interlayer insulating layers 303 are formed at the upper and lower surfaces of the circuit board 190, and that the first via holes 311 are formed in both the first interlayer insulating layers 303, but note that the laser processing is performed as the processing process on one side at a time. In the other steps described later (FIGS. 39 to 45) as well, processing is similarly performed on one side at a time.

Figure 39:
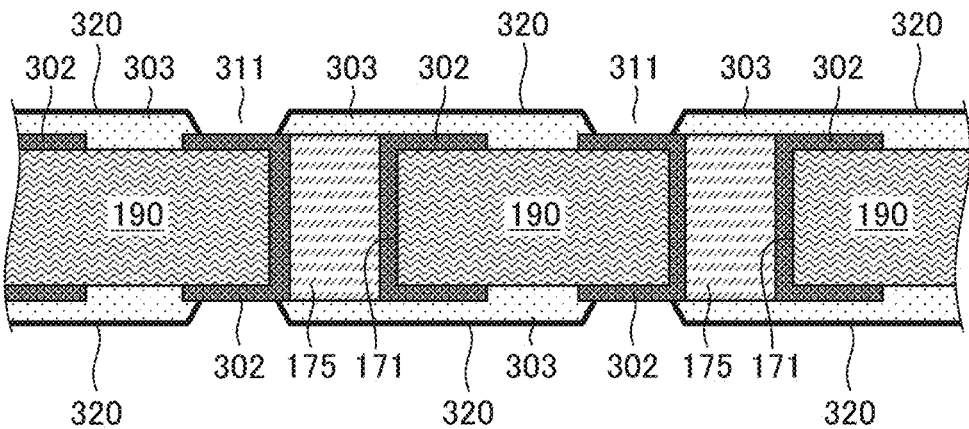
FIG. 39 is a cross-sectional view showing an example of a seed layer formation step.

FIG. 39 is a cross-sectional view showing an example of the seed layer formation step. After the formation of the first via holes 311, seed layers 320, which serve as a ground for conductor layers (second conductor layers 324 in FIG. 41) in plating in one of the following steps are formed.

Figure 40:
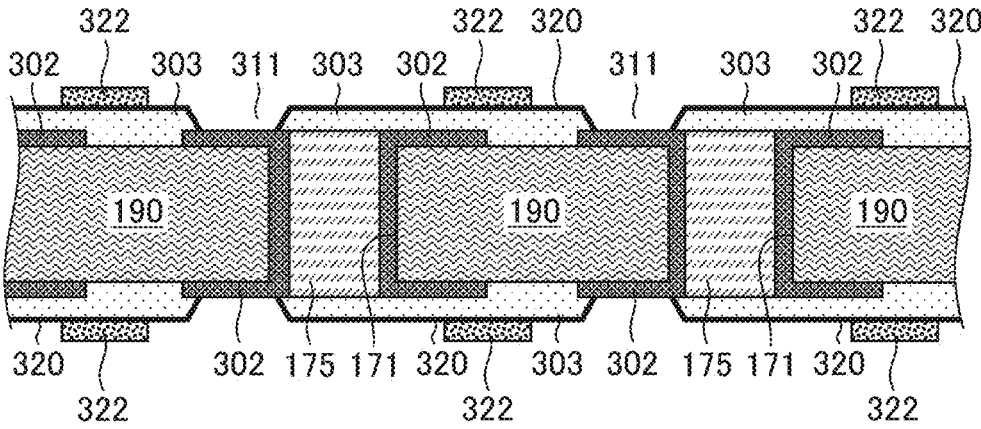
FIG. 40 is a cross-sectional view showing an example of a photoresist formation step.

FIG. 40 is a cross-sectional view showing an example of the photoresist formation step. After the formation of the seed layers 320, a photoresist 322 is applied onto the entire surfaces and then developed by mask exposure to leave the photoresist 322 at predetermined locations. FIG. 40 shows the photoresist 322 left at the predetermined locations.

Figure 41:
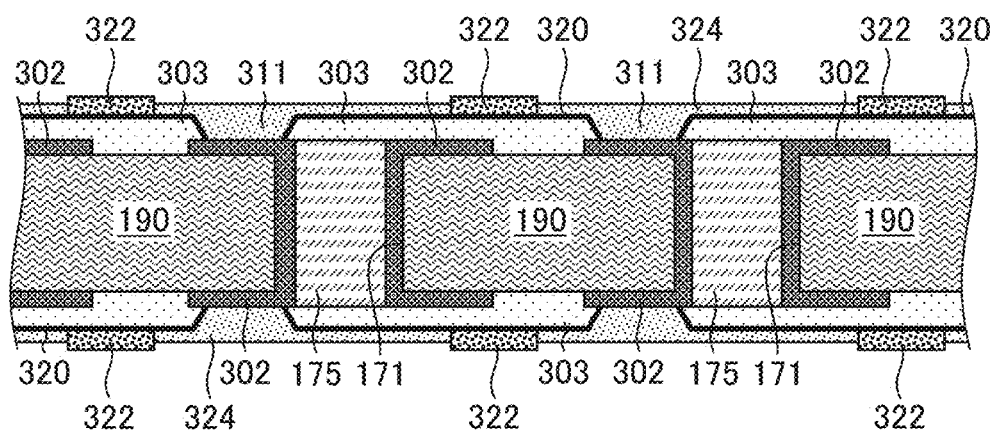
FIG. 41 is a cross-sectional view showing an example of a conductor layer formation step.

FIG. 41 is a cross-sectional view showing an example of the conductor layer formation step. After the formation of the photoresist 322 at the predetermined locations, second conductor layers 324 are formed by plating on the seed layers 320. The second conductor layers 324 may be made, for example, of Cu.

Figure 42:
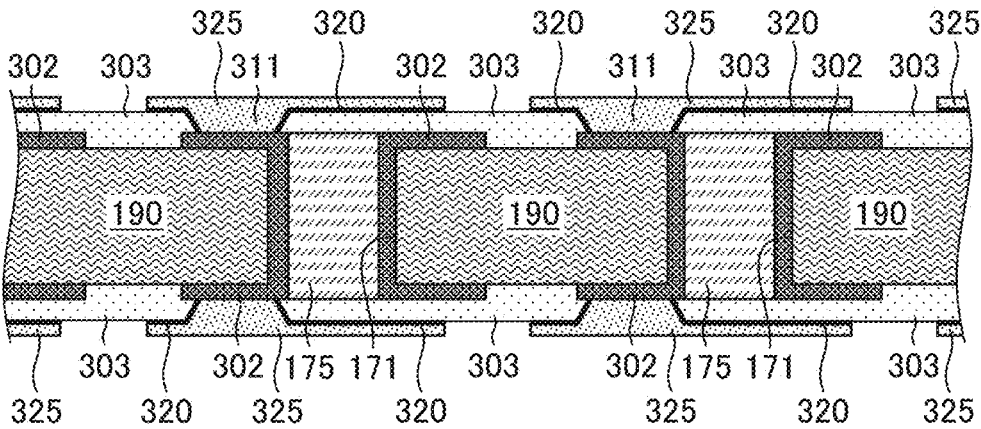
FIG. 42 is a cross-sectional view showing an example of a first land formation step.

FIG. 42 is a cross-sectional view showing an example of the first land formation step. After the formation of the second conductor layers 324, the photoresist 322 and the seed layers 320 are removed to form independent conductor layers 325 on the first interlayer insulating layers 303. Out of the independent conductor layers 325, the conductor layer formed around each of the via holes is called a "land". The lands formed of the conductor layer 325 shown in FIG. 42 are each called a "first land".

Figures 43, 44:
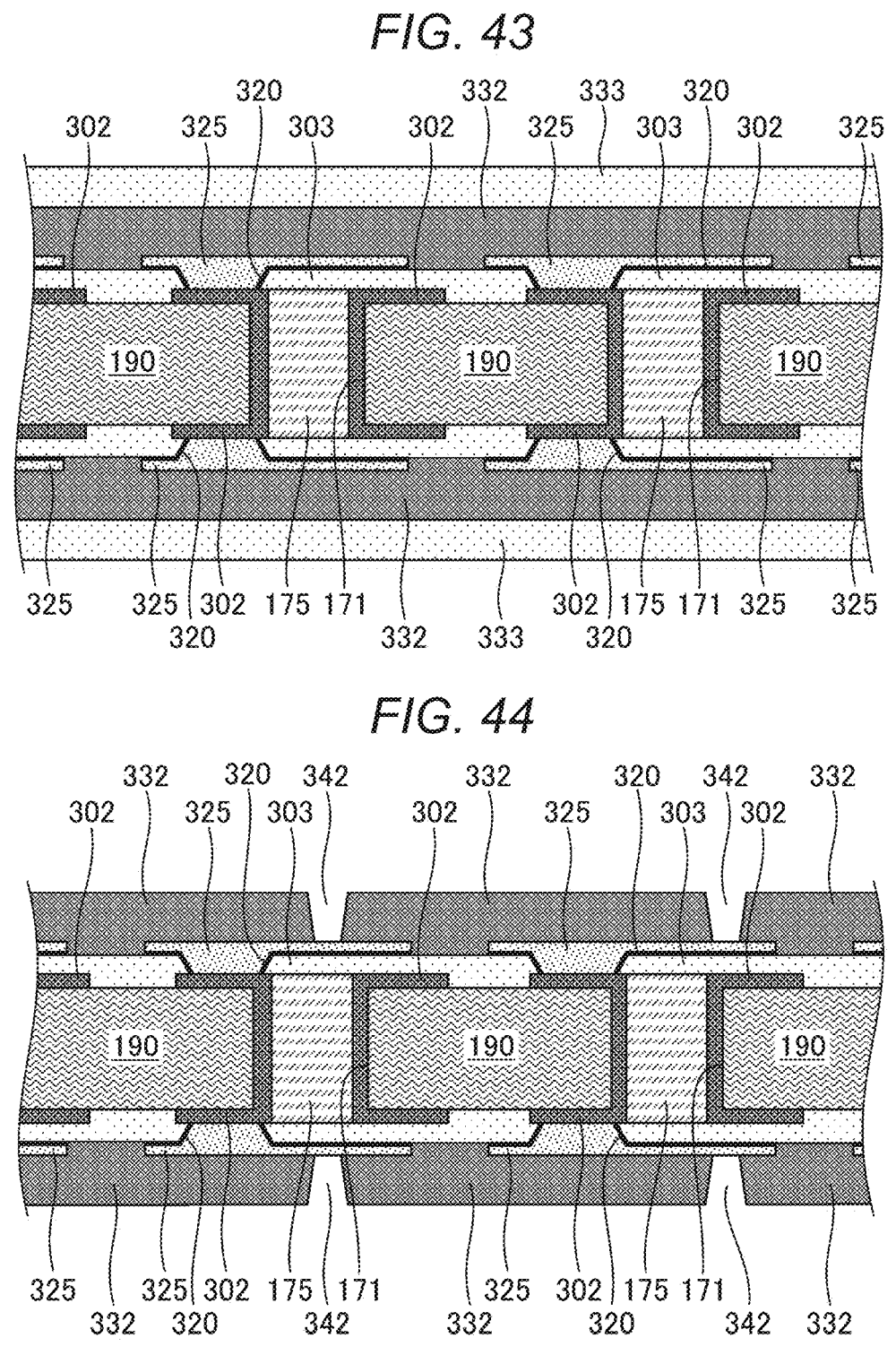

FIG. 43 is a cross-sectional view showing an example of the second interlayer insulating layer and sacrificial layer formation step. After the formation of the first lands, second interlayer insulating layers 332 and sacrificial layers 333 are laminated on the entire structure so as to cover the first interlayer insulating layers 303 and the conductor layers 325, or the entire structure is coated with the second interlayer insulating layers 332 and the sacrificial layers 333 so that the second interlayer insulating layers 332 and the sacrificial layers 333 cover the first interlayer insulating layers 303 and the conductor layers 325. The second interlayer insulating layers 332 may be made of the same material of which the first interlayer insulating layers 303 are made. The second interlayer insulating layers 332 are an example of the "insulating layer" and a "second insulating layer" in the present disclosure. The sacrificial layers 333 are an example of a "second sacrificial layer" in the present disclosure.

FIG. 44 is a cross-sectional view showing an example of the second via hole formation and sacrificial layer removal step. The stacked structure shown in FIG. 43 is irradiated with the pulse laser light with the sacrificial layers 333 left to form second via holes 342, which expose part of the first lands. Although not shown in FIG. 44, when the sacrificial layers 333 are irradiated with the pulse laser light, second through holes are formed in the sacrificial layers 333, and the second interlayer insulating layers 332 are irradiated with the pulse laser light through the second through holes. After the formation of the second via holes 342 in the second interlayer insulating layers 332, the sacrificial layers 333 are removed. FIG. 44 shows the state in which the sacrificial layers 333 have been removed. The hole diameter of the second via holes 342 is smaller than that of the first via holes 311.

Figure 45:
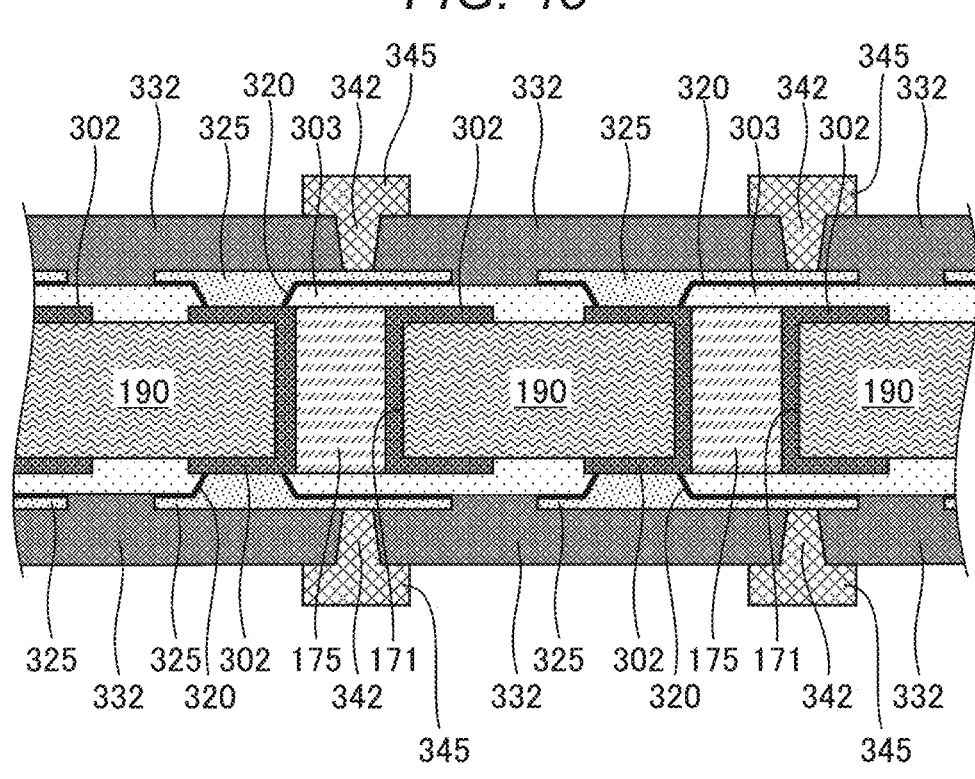
FIG. 45 is a cross-sectional view showing an example of a second land formation step.

FIG. 45 is a cross-sectional view showing an example of the second land formation step. After the formation of the second via holes 342, the same steps as the aforementioned seed layer formation step, photoresist formation step, conductor layer formation step, and first land formation step are carried out to leave and form conductor layers 345 each having a second land on the second interlayer insulating layers 332.

5.3 Effects

In general, in the case of a multilayer circuit board, the diameter of via holes required in each layer tends to decrease in size in inverse proportion to the distance from the circuit board. In addition, the depth of focus varies as the stacking progresses, so that the taper angle of the via holes formed in upper layers farther from the circuit board tends to worsen.

In this regard, in the multilayer circuit board manufactured by the method according to the third embodiment, in which the laser is radiated always with the interlayer insulating layers covered with sacrificial layers in the via hole formation in each layer, via holes having a satisfactory taper angle can be formed in any layer.

Figure 46:
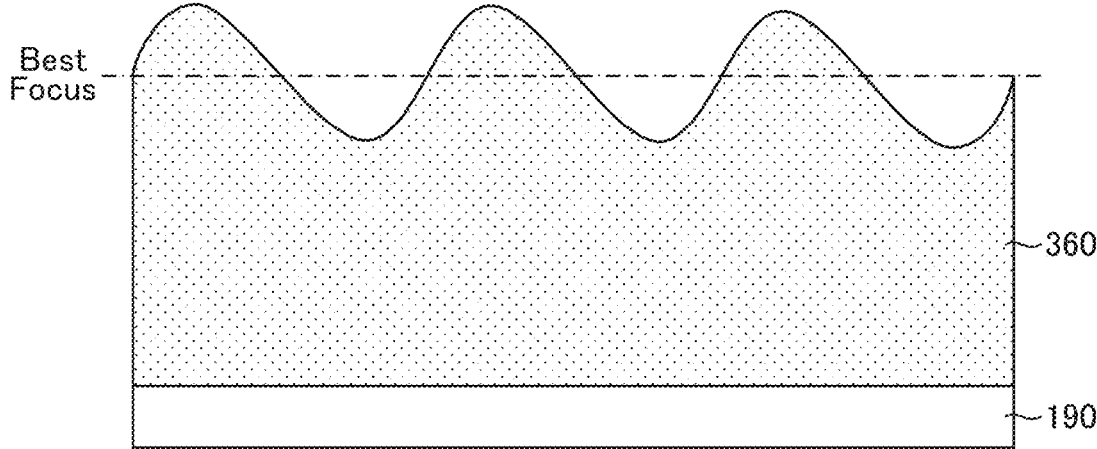
FIG. 46 is a cross-sectional view diagrammatically showing an illustration of steps at the surface of a build-up substrate.

The effect provided by the third embodiment will be further described in comparison with Comparative Example with reference to FIGS. 46 to 50. FIG. 46 is a cross-sectional view diagrammatically showing an illustration of steps at the surface of a build-up substrate. The surface of a processed product 360 undulates as a plurality of layers are stacked on the circuit board 190, which serves as a core, into a multi-layered structure. The focus position at the surface of the processed product 360 thus varies.

Figure 47:
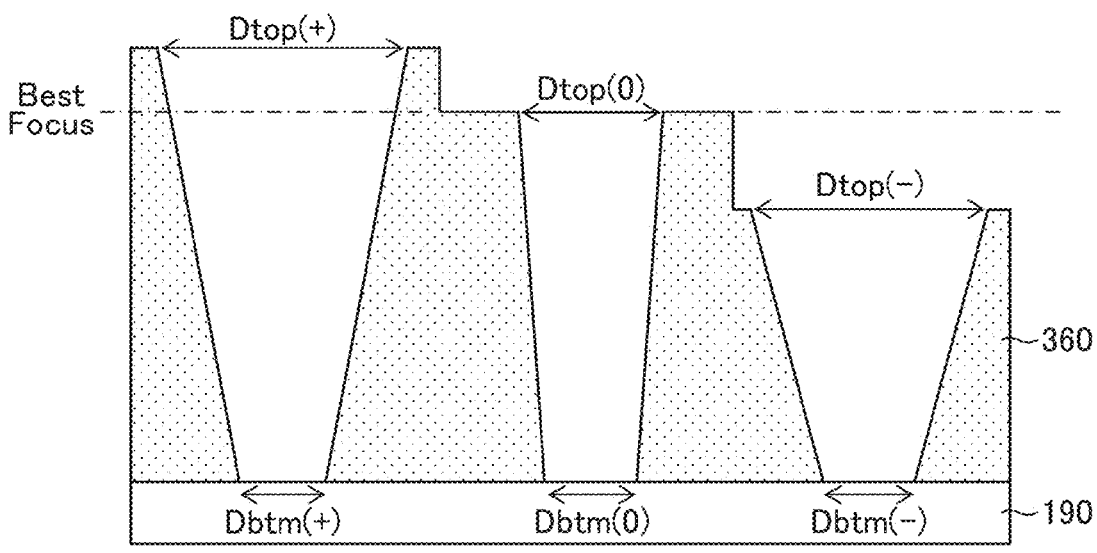
FIG. 47 is a cross-sectional view diagrammatically showing an illustration of a processed product produced by the laser processing performed without a sacrificial layer.
Figure 48:
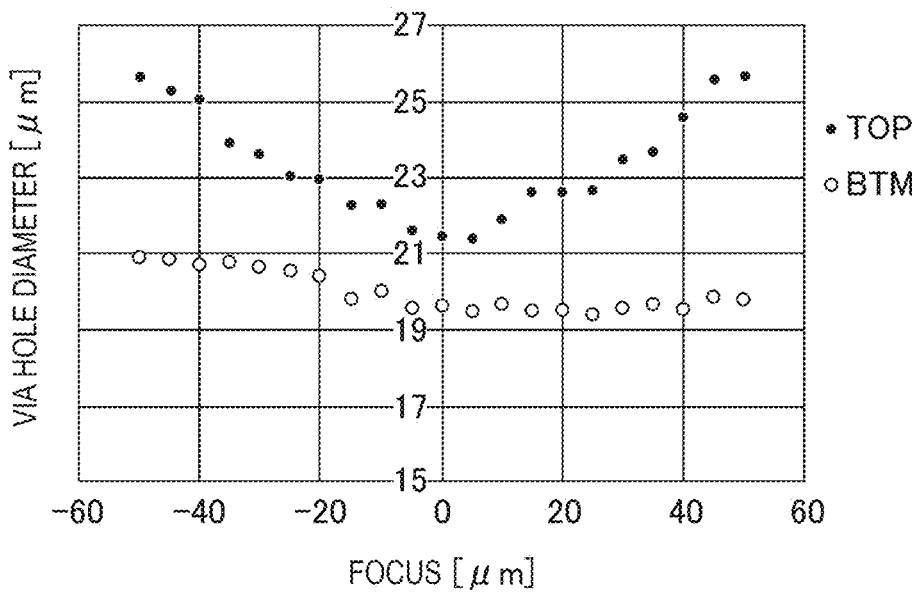
FIG. 48 is a graph showing the relationship between the focus position and the via hole diameter in the laser processing method according to Comparative Example.

FIGS. 47 and 48 show the result of the processing performed in accordance with the laser processing method according to Comparative Example. FIG. 47 is a cross-sectional view diagrammatically showing an illustration of a processed product produced by the laser processing performed without a sacrificial layer. FIG. 48 is a graph showing the relationship between the focus position and the via hole diameter in the laser processing method according to Comparative Example.

When the degree of the undulation of the surface of the interlayer insulating layer increases as the stacking progresses, via holes need to be formed in some cases in the interlayer insulating layer having a surface greatly shifted from the best focus position. When the interlayer insulating layer (without sacrificial layer) in the state described above is irradiated with the laser light by using the laser processing method according to Comparative Example, a via hole having a top diameter that varies greatly depending on the absolute value of the distance from the best focus position is undesirably formed.

In FIG. 47, Dtop(0) and Dbtm(0) represent the top and bottom diameters of a via hole produced when the laser light is radiated to the surface of the interlayer insulating layer located in the best focus position. In FIG. 47, Dtop(+) and Dbtm(+) represent the top and bottom diameters of a via hole formed when the surface of the interlayer insulating layer is located above the best focus position (in the +Z-axis direction). In FIG. 47, Dtop(−) and Dbtm(−) represent the top and bottom diameters of a via hole formed when the surface of the interlayer insulating layer is located below the best focus position (in the −Z-axis direction).

When the surface of the interlayer insulating layer undulates in the Z-axis direction, focus shift occurs at the surface and causes an increase in the diameter of the via hole, in particular, the top diameter, as shown in FIG. 47.

The variation of the bottom diameter of the via hole due to the change in focus position is relatively small, but the variation in the top diameter is relatively large, as shown in FIG. 48, so that the taper angle θ of the via hole deteriorates.

Figure 49:
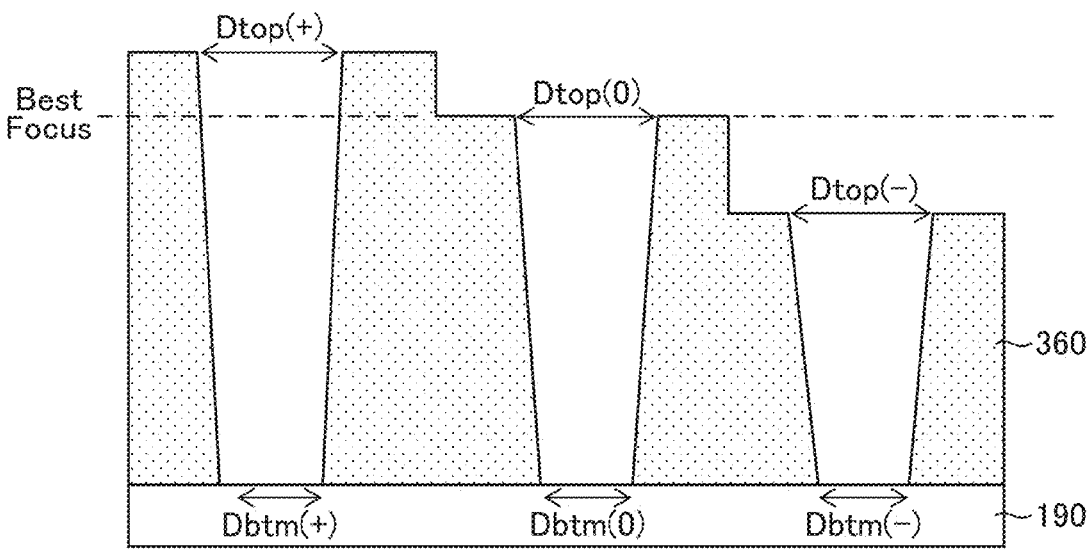
FIG. 49 is a cross-sectional view diagrammatically showing an illustration of a processed product produced by the laser processing performed with a sacrificial layer.
Figure 50:
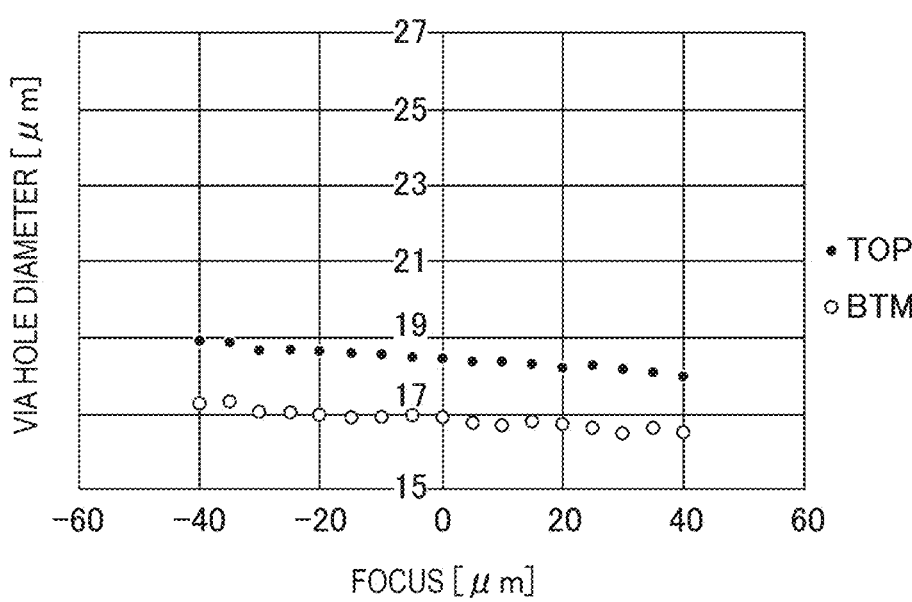
FIG. 50 is a graph showing the relationship between the focus position and the via hole diameter in the laser processing method according to a third embodiment.

FIGS. 49 and 50 show the result of the processing performed in accordance with the laser processing method according to the third embodiment. FIG. 49 is a cross-sectional view diagrammatically showing an illustration of a processed product produced by the laser processing performed with a sacrificial layer. FIG. 50 is a graph showing the relationship between the focus position and the via hole diameter in the laser processing method according to the third embodiment. The top diameter is substantially fixed even when focus shift occurs. The value of the bottom diameter is also substantially fixed even when the focus position (surface position) deviates from the best focus position. Performing the via hole processing with a sacrificial layer therefore increases a margin against a focus position shift.

That is, when the laser light is radiated with the sacrificial layer left, a top diameter having a small dependence on the shift from the best focus position is achieved. At the same time, since the variation in the bottom diameter of the via hole is small, a via hole having a satisfactory taper angle θ (shape) can be formed even in the circuit board 190 in which a large number of layers are stacked on each other.

5.4 Variations

The third embodiment has been described with reference to the case where the first via holes 311 and the second via holes 342 are formed, and the same steps may be repeated to further increase the number of layers to be stacked. The third embodiment has been further described with reference to the case where interlayer insulating layers are stacked on opposite sides of the circuit board 190, which serves as the inner layer substrate, and an aspect in which an interlayer insulating layer is stacked only on one surface of the circuit board 190 is also conceivable.

6. Fourth Embodiment

6.1 Configuration

Figures 51, 52:
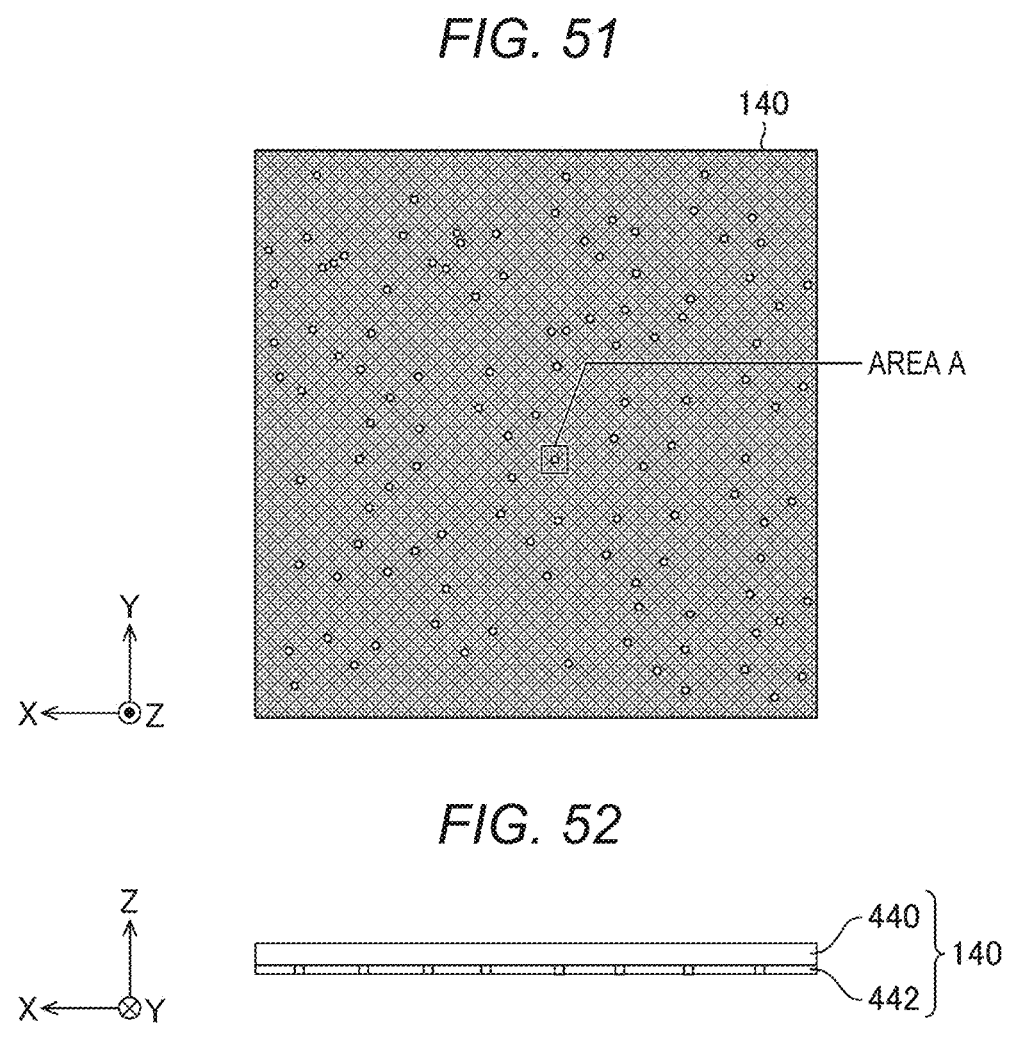

FIG. 51 is a plan view showing an example of a mask pattern of the mask 140 used in the laser processing system 10 according to a fourth embodiment. FIG. 52 is a side view of the mask 140 shown in FIG. 51. The mask 140 has a structure in which a light blocking film 442 is stacked on a synthetic quartz substrate 440. The light blocking film 442 has a mask pattern formed thereon and corresponding to light transmitting portions for the via hole processing. The light blocking film 442 may, for example, be an aluminum film, and the aluminum film may be coated with a protective film that is not shown.

Figure 53:
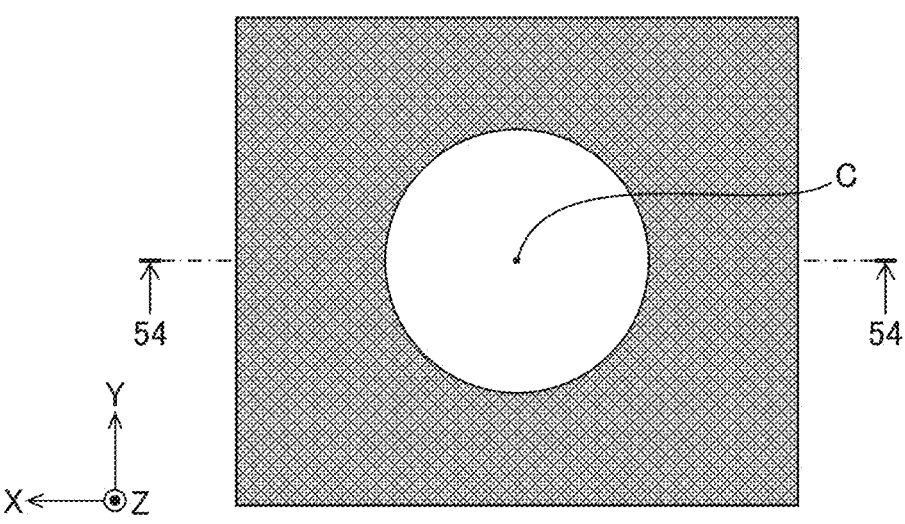
FIG. 53 is an enlarged view of an area A in FIG. 51.
Figure 54:
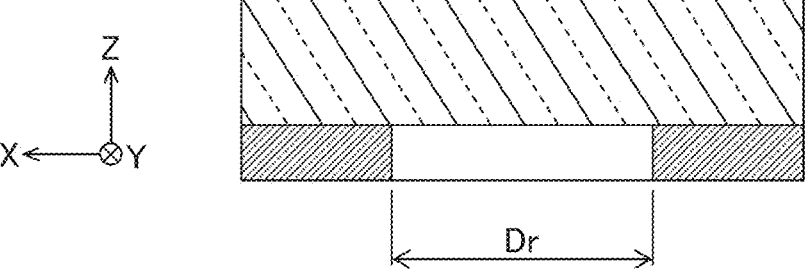
FIG. 54 is a cross-sectional view taken along the line 54-54 in FIG. 53.

FIG. 53 is an enlarged view of an area A surrounded by a quadrangle in FIG. 51. FIG. 54 is a cross-sectional view taken along the line 54-54 in FIG. 53. To process a via hole having the target hole diameter Dt, a hole diameter Dr, through which the mask 140 transmits the laser light, (light transmitting diameter) is corrected.

Let M be the magnification of the projection optical system, and the hole diameter Dr of the mask pattern is expressed by the expression below.

$$Dr \cdot M = Di \tag{10}$$

In addition, Expression (11) is derived from Expression (6) having been described.

$$Dt \fallingdotseq Dtop = Di - \Delta D \tag{11}$$

Expression (12) is derived from Expressions (10) and (11).

$$Dr = (Dt + \Delta D) / M \tag{12}$$

The mask 140 is therefore preferably so manufactured that the hole diameter Dr of the mask pattern is expressed by Expression (12). According to the example shown in FIG. 31, ΔD is a value specified to fall within the range from 0.8 μm to 3.3 μm in accordance with the thickness of the sacrificial layer.

The center position of the hole, of the mask pattern, having the light transmitting diameter may be uncorrected, and when the magnification of the projection optical system is M, the center position of the hole, of the mask pattern, having the light transmitting diameter is multiplied by 1/M.

6.2 Operation

The operation of the laser processing system 10 according to the fourth embodiment is the same as the operation described in the first embodiment.

27
6.3 Effects

Processing with the mask 140 having a corrected hole diameter in the mask pattern allows via hole processing of a via hole having a desired diameter.

7. Examples of Material of Interlayer Insulating Layer

The interlayer insulating layers can be made of any material suitable for the circuit board without any limitation, for example, a composition containing thermosetting resin such as epoxy resin, cyanate ester resin, phenol resin, bismaleimide-triazine resin, polyimide resin, acrylic resin, and vinyl benzyl resin to which at least a curing agent thereof is added. The composition is preferably a composition containing epoxy resin as the thermosetting resin, for example, a composition containing epoxy resin, thermoplastic resin, and a curing agent. The Ajinomoto build-up film (registered trademark) may also be used.

8. Examples of Material of Sacrificial Layer

The material used to form the sacrificial layer is not limited to a specific material, and may, for example, be polyester such as polyethylene terephthalate (PET) and polyethylene naphthalate (PEN), polycarbonate (PC), acryl (PMMA), cyclic polyolefin, triacetyl cellulose (TAC), polyether sulfide (PES), polyetherketone, and polyimide. Among the materials described above, a polyester layer such as a polyethylene terephthalate layer and a polyethylene naphthalate layer is preferable, and an inexpensive polyethylene terephthalate layer is particularly preferable. The sacrificial layers may be mudded or corona treated.

The sacrificial layers may instead be layers made of polytetrafluoroethylene (PTFE), perfluoroalkoxy resin (PFA), copolymers of tetrafluoroethylene and hexafluoropropylene (FEP), copolymers of tetrafluoroethylene, perfluoroalkylvinyl ether and hexafluoropropylene (EPE), copolymers of tetrafluoroethylene and ethylene or propylene (ETFE), and fluorinated resin (for example, polyvinylidene fluoride (PVDF), and polyvinyl fluoride (PVF)).

9. Examples of Radiation Conditions Under which Pulse Laser Light is Radiated

The first to fourth embodiments have been described with reference to the case where KrF excimer laser light (having wavelength of 248 nm) is used, and the pulse laser light is not necessarily outputted from a KrF excimer laser, and any other laser light having another ultraviolet wavelength may be used. For example, ArF excimer laser light having a wavelength of 193 nm or XeCl excimer laser light having a wavelength of 308 nm may be used.

The radiation conditions under which the pulse laser light is radiated are determined as appropriate in accordance with the workpiece 160. FIG. 19 shows that the repetition frequency of the pulse laser light is 4000 Hz by way of example, but the repetition frequency is not limited to 4000 Hz. The repetition frequency preferably ranges, for example, from 400 Hz to 6000 Hz.

FIG. 19 shows that the pulse width of the pulse laser light is 20 ns by way of example, but the pulse width is not limited to 20 ns. The pulse width preferably ranges, for example, from 10 ns to 60 ns.

FIG. 19 shows that the radiated pulse count is 180 pulses [pls] by way of example, but the radiated pulse count is not limited to 180 pulses. For example, to form a through hole in the sacrificial layer 176 made of PET and having a thickness of 5.7 μm, the radiated pulse count at a fluence of 1000 mJ/cm$^2$ is 10 pulses. When the thickness of the sacrificial layer 176 is greater than or equal to 5.7 μm, the pulse count of the pulse laser light radiated onto the sacrificial layer 176 to form a through hole in the sacrificial layer 176 is greater than or equal to 10 pulses.

10. Method for Manufacturing Circuit Board

After the formation of via holes in the workpiece 160 by using the laser processing method described in any of the first to fourth embodiments, a circuit board can be manufactured through a plurality of processes, and an electronic device including the circuit board can be further manufactured. The laser processing methods described in the first to fourth embodiments are not necessarily applied to the processing of via holes in a circuit board, and is applicable to the processing of holes in a variety of applications. Holes formed in place of via holes are not limited to through holes, and may instead be bottomed holes.

11. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of any thereof and any other than A, B, and C.

What is claimed is:

1. A laser processing method comprising:
radiating ultraviolet pulse laser light onto a workpiece having a stacked structure in which a conductor layer, an insulating layer, and a sacrificial layer are stacked on each other in the presented order, the pulse laser light radiated from a side facing the sacrificial layer, to start processing of a hole extending from a surface of the sacrificial layer toward the conductor layer using laser ablation, and changing a laser ablation processing mode in the sacrificial layer with progress of the laser ablation to form a through hole in the sacrificial layer;
radiating the pulse laser light onto the insulating layer through the through hole to form an opening in the insulating layer; and
removing the sacrificial layer after the formation of the opening,
wherein a laser processing apparatus including a mask having a mask pattern corresponding to the opening and a projection optical system configured to project an image of the mask onto the workpiece, the mask and the projection optical system disposed on an optical path of the pulse laser light, is used to form the opening by transferring the image of the mask via the projection optical system to radiate the pulse laser light onto the workpiece, a position where the pulse laser light radiated via the projection optical system forms the image is between a surface of the sacrificial layer and an interface between the sacrificial layer and the insulating layer, and the mask has a light transmitting diameter across which the mask pattern transmits light corrected based on a target hole diameter to be formed in the insulating layer, an amount of shift of a processed hole diameter according to a thickness of the sacrificial layer, and a magnification of the projection optical system.

2. The laser processing method according to claim 1, wherein the sacrificial layer has a thickness ranging from 5.7 μm to 40 μm.

3. The laser processing method according to claim 1, wherein the pulse laser light has a fluence ranging from 600 mJ/cm$^2$ to 1000 mJ/cm$^2$.

4. The laser processing method according to claim 1, wherein the pulse laser light has a pulse width ranging from 10 ns to 60 ns.

5. The laser processing method according to claim 1, wherein the pulse laser light has a wavelength of one of 193 nm, 248 nm, and 308 nm.

6. The laser processing method according to claim 1, wherein the pulse laser light has a repetition frequency ranging from 400 Hz to 6000 Hz.

7. The laser processing method according to claim 1, wherein the formed opening has a diameter ranging from 3 μm to 20 μm.

8. The laser processing method according to claim 1, wherein a pulse count of the pulse laser light radiated onto the sacrificial layer to form the through hole in the sacrificial layer is greater than or equal to 10 pulses.

9. The laser processing method according to claim 1, wherein the processing mode changes from a surface processing mode to an internal processing mode in the sacrificial layer.

10. The laser processing method according to claim 1, further comprising:

preparing a first stacked structure in which a support layer, the sacrificial layer, and the insulating layer are stacked on each other in the presented order;

superimposing the first stacked structure on a circuit board including the conductor layer with the insulating layer facing the conductor layer so that the first stacked structure covers the conductor layer to form a second structure in which the circuit board, the conductor layer, the insulating layer, the sacrificial layer, and the support layer are stacked on each other in the presented order; and producing the workpiece by removing the support layer from the second stacked structure to expose the sacrificial layer.

11. The laser processing method according to claim 10, wherein the support layer is thicker than the sacrificial layer.

12. The laser processing method according to claim 10, wherein the support layer and the sacrificial layer are made of polyethylene terephthalate.

13. The laser processing method according to claim 1, wherein the light transmitting diameter is corrected based on a relationship $$Dr = (Dt + \Delta D)/M$$

where Dt represents the target hole diameter, ΔD represents the amount of shift, M represents the magnification of the projection optical system, and Dr represents the light transmitting diameter across which the mask pattern transmits light, and ΔD is specified to fall within a range from 0.8 μm to 3.3 μm in accordance with the thickness of the sacrificial layer.

14. The laser processing method according to claim 1, wherein the sacrificial layer is made of polyethylene terephthalate.

15. The laser processing method according to claim 1, wherein the insulating layer contains epoxy resin.

16. A circuit board manufacturing method comprising:

radiating ultraviolet pulse laser light onto a circuit board having a stacked structure in which a first conductor layer, a first insulating layer, and a first sacrificial layer are stacked on a principal surface of the circuit board in the presented order, the pulse laser light radiated from a side facing the first sacrificial layer, to start processing of a hole extending from a surface of the first sacrificial layer toward the first conductor layer using laser ablation, and changing a laser ablation processing mode in the first sacrificial layer with progress of the laser ablation to form a first through hole in the first sacrificial layer;

radiating the pulse laser light onto the first insulating layer through the first through hole to form a first via hole in the first insulating layer; and removing the first sacrificial layer after the formation of the first via hole, wherein a laser processing apparatus including a mask having a mask pattern corresponding to the first via hole and a projection optical system configured to project an image of the mask onto the circuit board, the mask and the projection optical system disposed on an optical path of the pulse laser light, is used to form the first via hole by transferring the image of the mask via the projection optical system to radiate the pulse laser light onto the circuit board, a position where the pulse laser light radiated via the projection optical system forms the image is between a surface of the first sacrificial layer and an interface between the first sacrificial layer and the first insulating layer, and the mask has a light transmitting diameter across which the mask pattern transmits light corrected based on a target hole diameter to be formed in the first insulating layer, an amount of shift of a processed hole diameter according to a thickness of the first sacrificial layer, and a magnification of the projection optical system.

17. The circuit board manufacturing method according to claim 16, further comprising:

stacking a second conductor layer, a second insulating layer, and a second sacrificial layer on the first insulating layer in the presented order after the removal of the first sacrificial layer;

radiating the pulse laser light onto the circuit board from a side facing the second sacrificial layer to change a laser ablation processing mode in the second sacrificial layer and form a second through hole in the second sacrificial layer;

radiating the pulse laser light onto the second insulating
layer through the second through hole to form a second
via hole in the second insulating layer; and
removing the second sacrificial layer after the formation
of the second via hole.

* * * * *